United States Patent
Rodbell et al.

(10) Patent No.: US 11,683,995 B2
(45) Date of Patent: Jun. 20, 2023

(54) LITHOGRAPHY FOR FABRICATING JOSEPHSON JUNCTIONS

(71) Applicant: International Business Machines Corporation, Armonk, NY (US)

(72) Inventors: Kenneth P. Rodbell, Sandy Hook, CT (US); Leonidas Ernesto Ocola, Wappingers Falls, NY (US); Charles Thomas Rettner, San Jose, CA (US); Mary E Rothwell, Ridgefield, CT (US); Elbert Emin Huang, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 16/983,642

(22) Filed: Aug. 3, 2020

(65) Prior Publication Data
US 2022/0037578 A1 Feb. 3, 2022

(51) Int. Cl.
*H01L 39/24* (2006.01)
*H10N 60/01* (2023.01)
*H10N 60/80* (2023.01)

(52) U.S. Cl.
CPC ....... *H10N 60/0912* (2023.02); *H10N 60/805* (2023.02)

(58) Field of Classification Search
CPC ......... H01L 39/025; H01L 39/223–226; H01L 39/2493–2496; H01L 39/00–2496; H10N 60/805; H10N 60/12–126; H10N 60/0912–0941
See application file for complete search history.

(56) References Cited

U.S. PATENT DOCUMENTS

| | | | |
|---|---|---|---|
| 4,256,816 A | 3/1981 | Dunkleberger | |
| 4,533,624 A | 8/1985 | Sheppard | |
| 4,904,619 A | 2/1990 | Yamada et al. | |
| 9,768,371 B2 | 9/2017 | Ladizinsky et al. | |
| 10,109,673 B2 | 10/2018 | Tolpygo | |
| 2004/0135139 A1 | 7/2004 | Koval et al. | |
| 2015/0357189 A1* | 12/2015 | Davis | H01L 29/1606 257/29 |

(Continued)

FOREIGN PATENT DOCUMENTS

| | | | | |
|---|---|---|---|---|
| JP | 2535755 B2 | 9/1996 | | |
| WO | WO-2018031006 A1 * | 2/2018 | ............. | B82Y 10/00 |
| WO | WO-2019180267 A1 * | 9/2019 | ............. | B82Y 10/00 |

OTHER PUBLICATIONS

Reikebaum, et al, "Improving wafer-scale Josephson junction resistance variation in superconducting quantum coherent circuits" arXiv:1909.09165v2 [quant-ph] May 7, 2020, 10 pages.

*Primary Examiner* — Shahed Ahmed
(74) *Attorney, Agent, or Firm* — Erik Johnson

(57) ABSTRACT

Techniques regarding lithographic processes for fabricating Josephson junctions are provided. For example, one or more embodiments described herein can comprise a method that can include depositing a first resist layer onto a second resist layer. The first resist layer can include a bridge portion that defines an opening for forming a Josephson junction. The method can also comprise depositing a third resist layer onto the bridge portion. The third resist layer can shield the opening from an angled deposition of a superconducting material during fabrication of the Josephson junction.

19 Claims, 14 Drawing Sheets

(56) References Cited

U.S. PATENT DOCUMENTS

2020/0044137 A1    2/2020   Schueffelgen
2021/0151653 A1*   5/2021   Holmes .................. H01L 39/24
2021/0313507 A1*  10/2021   Gao ................. H01L 21/30608

* cited by examiner

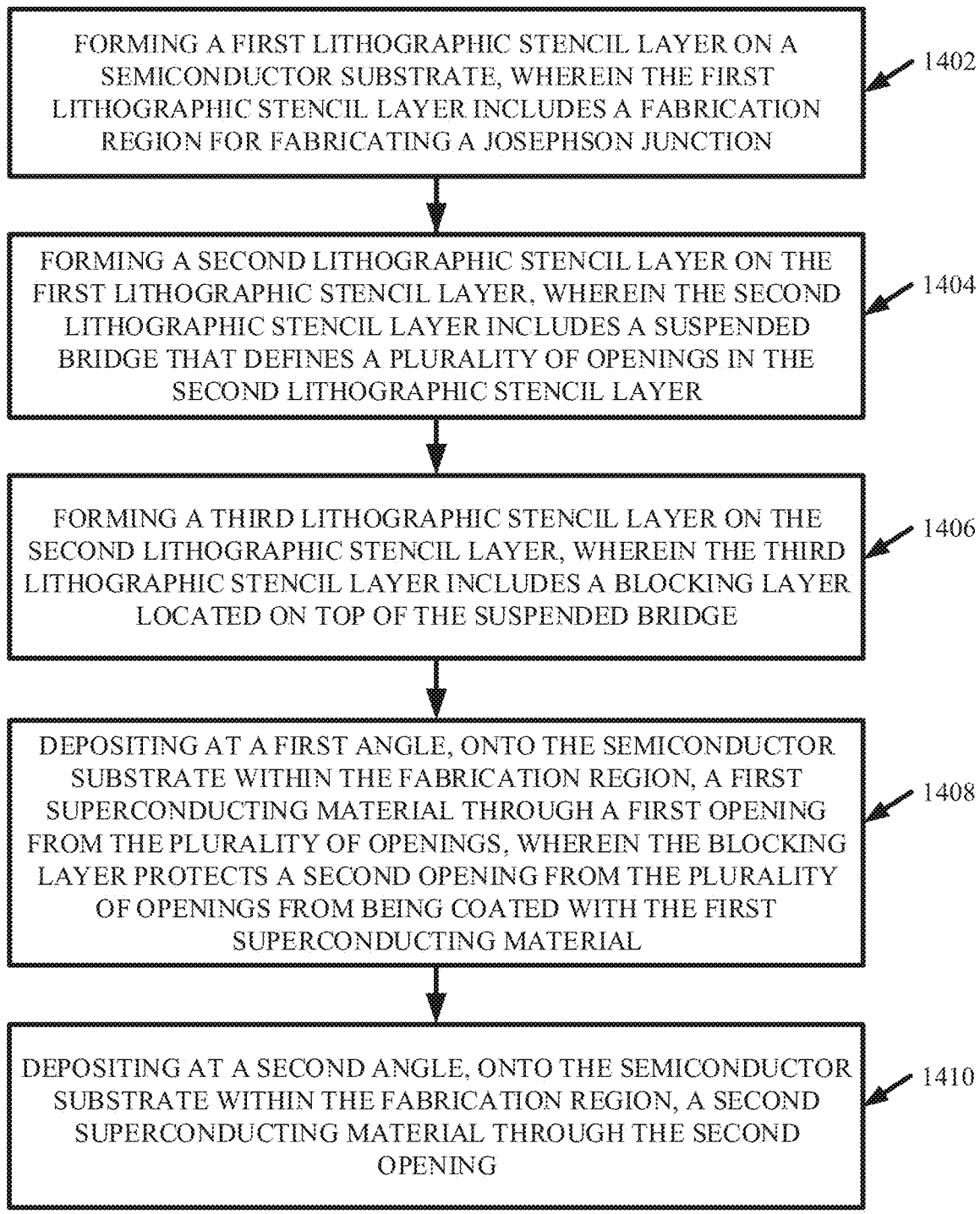

LITHOGRAPHY FOR FABRICATING JOSEPHSON JUNCTIONS

BACKGROUND

The subject disclosure relates to lithographic stencil structures and/or processes for fabricating Josephson junctions, and more specifically, to lithography processes that utilize a three layer lithographic stencil structure in conjunction with a shadow mask technique to fabricate Josephson junctions for quantum computing devices.

Josephson junctions are commonly fabricated using a double-angle shadow evaporation technique where superconducting material is deposited through an offset lithography mask. A tunnel barrier of the Josephson junctions can be formed by oxidation of a superconducting material base layer. The shadow evaporation technique uses an evaporation mask that is suspended above a substrate upon which the Josephson junction is formed. Traditionally, the evaporation mask is formed of two lithographic resist layers. Depending on the evaporation angle, a shadow image of the mask can be projected onto different positions on the substrate. By choosing respective angles for sequential depositions, adjacent openings in the evaporation mask can be projected on the same substrate position, thereby facilitating an overlay of two thin films of deposited superconducting material with a defined geometry.

However, where the evaporation mask is comprised of two resist layers, an electron beam dose required to develop the bottom resist layer can cause an undesirable thinning of one or more sections of the top resist layer. Additionally, the first superconducting material deposition can coat the top resist layer such that one or more of the openings in the evaporation mask are narrowed by deposited superconducting material. Due to the narrowing of the one or more openings, the deposition path of a subsequent deposition can be distorted; thereby the shape of one or more features formed by the subsequent superconducting material deposition can likewise become distorted. Thus, the thinning of the top resist layer and/or the narrowing of openings in the top resist layer can distort the shape of corresponding deposited features during fabrication of the Josephson junction.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods regarding lithography processes for fabricating one or more Josephson junctions are described.

According to an embodiment, a method is provided. The method can comprise depositing a first resist layer onto a second resist layer. The first resist layer includes a bridge portion that defines an opening for forming a Josephson junction. The method can also comprise depositing a third resist layer onto the bridge portion. The third resist layer can shield the opening from an angled deposition of a superconducting material during fabrication of the Josephson junction. An advantage of such a method can be the fabrication of a lithographic stencil that can achieve smooth Josephson junction geometries.

In some examples, the second resist layer can comprise polydimethylglutarimide, the first resist layer can comprise polymethylmethacrylate, and the third resist layer can comprise poly(methylmethacrylate/methacrylic acid) copolymer. An advantage of such a method can be the ability to deposit and/or pattern one or more of the resist layers without deteriorating adjacent resist layers.

According to another embodiment, a method is provided. The method can comprise forming a patterned resist layer onto a lift-off resist layer. The patterned resist layer can include a bridge portion that defines an opening in the patterned resist layer. The method can also comprise forming a blocking resist layer onto the bridge portion. The blocking resist layer can reduce exposure of the opening to an angled deposition of a superconducting material during fabrication of a Josephson junction. An advantage of such a method can be the patterning of the lift-off resist layer without diminishing a thickness of the bridge portion.

In some examples, the method can comprise depositing the superconducting material, via the angled deposition, through a second opening in the patterned resist layer and onto a semiconductor substrate. The method can also comprise depositing a second superconducting material through the opening and onto the superconducting material. An advantage of such an method can be the fabrication of one or more Josephson junctions via one or more angled deposition processes.

According to another embodiment, a method is provided. The method can comprise depositing a first lithographic stencil layer onto a second lithographic stencil layer. The first lithographic stencil layer can include a bridge portion that defines an opening for fabricating a Josephson junction on a substrate. The method can also comprise depositing a third lithographic stencil layer onto the first lithographic stencil layer. The third lithographic stencil layer can include a blocking portion located on top of the bridge portion. An advantage of such a method can be an enabled shielding of the opening by the blocking portion during one or more angled deposition processes.

In some examples, the method can comprise depositing, at a first angle, a first superconducting material through a second opening in the first lithographic stencil layer and onto the substrate. The blocking portion can protect the opening from being coated by the first superconducting material. An advantage of such a method can be that the dimensions of the opening can remain undistorted by the superconducting material deposition.

According to another embodiment, a method is provided. The method can comprise forming a first lithographic stencil layer onto a second lithographic stencil layer. The first lithographic stencil layer can include a suspended bridge portion. Also, the first lithographic stencil layer can include an opening along a side of the suspended bridge portion. Further, the method can comprise forming a third lithographic stencil layer on top of the suspended bridge portion and adjacent to the opening. An advantage of such a method can be the implementation of a deposition process employed at a 90 degree angle during fabrication of a Josephson junction.

In some examples, the method can comprise depositing, at a first angle, a first superconducting material through a second opening in the first lithographic stencil layer and onto a substrate. The third lithographic stencil layer can protect the opening from being coated by the first superconducting material. Further, the method can also comprise depositing, at a second angle, a second superconducting material through the opening and onto the first superconducting material. An advantage of such a method can be the depositing of superconducting material to fabricate one or more Josephson junctions without distortion resulting from previous deposition processes.

According to an embodiment, an apparatus is provided. The apparatus can comprise a first resist layer positioned on a second resist layer. The first resist layer includes a bridge portion that defines an opening in the first resist layer. The apparatus can also comprise a third resist layer positioned on the bridge portion. The third resist layer can have a thickness based on an angle at which the first resist layer is exposed to a material deposition process. An advantage of such an apparatus can be the fabrication of one or more Josephson junctions having smooth edges.

In some examples, the second resist layer can be patterned to include a second opening positioned under the bridge portion. For example, the second opening can be exposed by the opening in the first resist layer. Also, the second opening can define a Josephson junction fabrication region. Further, the second resist layer can be a lift-off resist layer. An advantage of such an apparatus can be the implementation of multiple angled deposition processes to fabricate one or more Josephson junctions characterized by a well defined geometry.

BRIEF DESCRIPTION OF THE DRAWINGS

FIG. 14 illustrates a flow diagram of an example, non-limiting method that can utilizing one or more three layer lithographic stencils in fabricating one or more Josephson junctions in accordance with one or more embodiments described herein.

DETAILED DESCRIPTION

Figure 1:
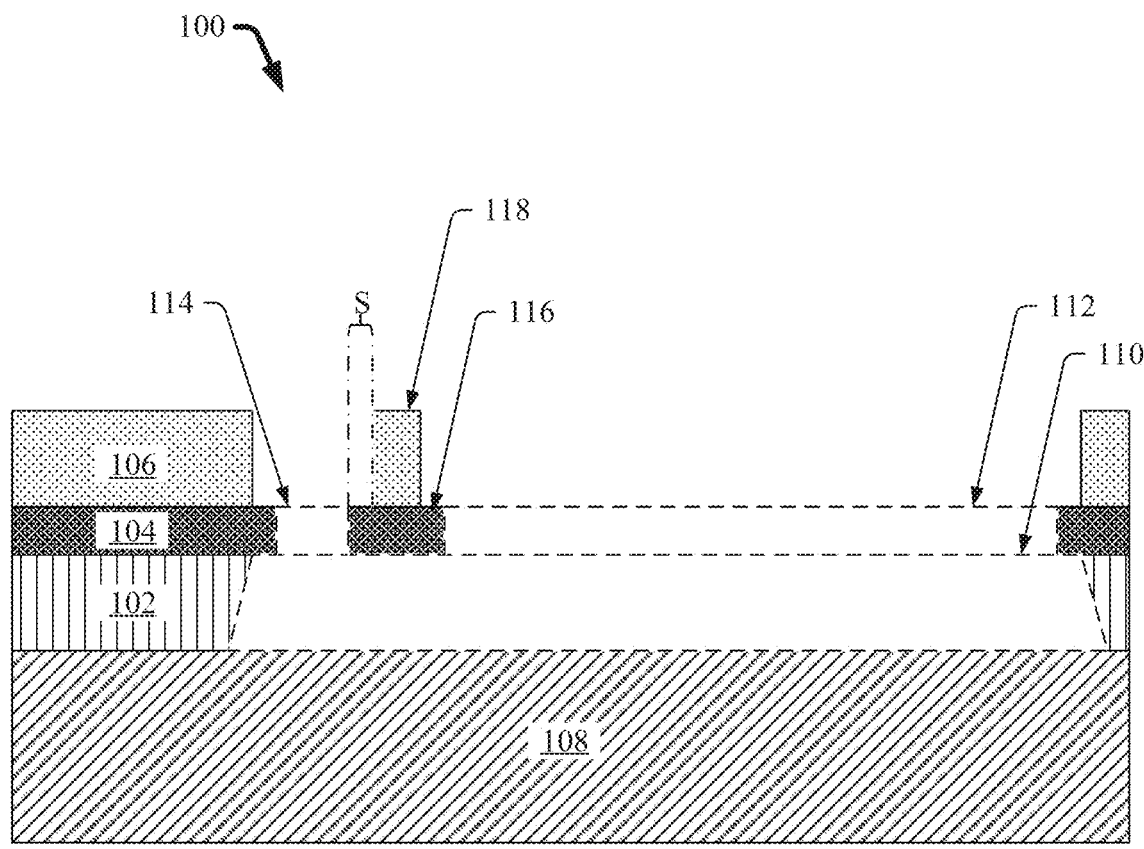
FIG. 1 illustrates a diagram of an example, non-limiting three layer lithographic stencil structure that can be utilized in fabricating one or more Josephson junctions in accordance with one or more embodiments described herein.
Figure 1:
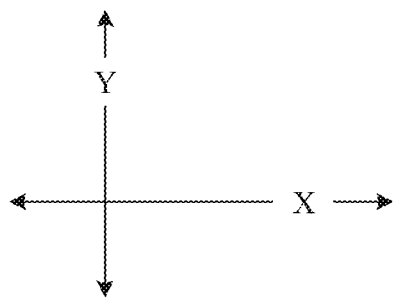

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the problems with other implementations of Josephson junction fabrication; the present disclosure can be implemented to produce a solution to one or more of these problems by utilizing a three layer lithographic stencil. Advantageously, one or more embodiments described herein can include a lithographic stencil for Josephson junction fabrication that includes a third, blocking resist layer positioned as the top layer of a three layer lithographic stencil structure. For example, the blocking resist layer can be positioned on at least a suspended bridge portion of a second layer of the lithographic stencil structure. The suspended bridge portion can define two adjacent openings in the three layer lithographic stencil, where the blocking resist layer can protect at least one of the openings from being coated with superconducting material during a first deposition process of the Josephson junction fabrication. Thereby, the blocking resist layer can protect the one or more openings from being distorted during the first deposition process. The one or more openings can be utilized to guide a second deposition process and define a shape of one or more Josephson junction features formed by the second deposition process. Thus, by shielding the one or more openings from being coated during the first deposition process, the blocking resist layer can protect the shape of the one or more Josephson junction features formed by the second deposition process from distortion.

In various embodiments, a lithography process for fabricating one or more Josephson junctions using a three layer lithographic stencil is described. The three layer lithographic stencil can include a top resist layer that blocks material from coating one or more defined openings during a first deposition process of the Josephson junction fabrication. Thereby, the top resist layer can protect the dimensions of the one or more defined openings from distortion during the first deposition process. In one or more embodiments, a bottom layer of the three layer lithographic stencil can be a lift-off resist layer, where the lift-off resist layer can be patterned without diminishing the structure of the other two layers of the three layer lithographic stencil. Additionally, one or more embodiments of the Josephson junction fabrication can include at least two superconducting material deposition processes performed at different depositing angles. For example, one or more of the deposition processes can be performed at a 90° depositing angle with respect to a substrate supporting the Josephson junction.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "lithography process" and/or "lithography processes" can refer to the formation of three-dimensional relief images or patterns on a semiconductor substrate for subsequent transfer of the pattern to the substrate. For example, the patterns can be formed by an electron beam light sensitive polymer called a photo-resist. To build the complex structures that make up a quantum device and the many wires that connect the various features of a quantum circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

FIG. 1 illustrates a diagram of an example, non-limiting three layer lithographic stencil 100 that can be implemented in one or more lithography processes for fabricating one or more Josephson junctions in accordance with various embodiments described herein. Repetitive description of like elements employed in other embodiments described herein is omitted for sake of brevity. FIG. 1 depicts a cross-sectional view of the three layer lithographic stencil 100 along the exemplary A-A' plane. The three layer lithographic stencil 100 can comprise a bottom resist layer 102, a middle resist layer 104, and/or a top resist layer 106. Further, the three layer lithographic stencil 100 can be positioned on a semiconductor substrate 108.

In various embodiments, the semiconductor substrate 108 can be crystalline, semi-crystalline, microcrystalline, or amorphous. The semiconductor substrate 108 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The semiconductor substrate 108 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the semiconductor substrate 108 can also have other layers, such as oxides with high dielectric constants ("high-K oxides") and/or nitrides. In one or more embodiments, the semiconductor substrate 108 can be a silicon wafer. In various embodiments, the semiconductor substrate 108 can comprise a single crystal silicon (Si), silicon germanium (e.g., characterized by the chemical formula SiGe), a Group III-V semiconductor wafer or surface/active layer, a combination thereof, and/or the like.

The bottom resist layer 102 can be a first lithographic stencil layer of the three layer lithographic stencil 100. As shown in FIG. 1, the bottom resist layer 102 can be patterned to define a fabrication region 110 (e.g., delineated by dashed lines in FIG. 1) on the semiconductor substrate 108. In various embodiments, one or more Josephson junctions can be formed within the fabrication region 110 during one or more lithography processes. For example, the fabrication region 110 can be comprised from one or more holes in the bottom resist layer 102. In various embodiments, the bottom resist layer 102 can have a thickness (e.g., along the Y-axis shown in FIG. 1) ranging from, for example, greater than or equal to 100 nanometers (nm) and less than or equal to 1 micron. For example, the bottom resist layer 102 can have an exemplary thickness (e.g., along the Y-axis shown in FIG. 1) of approximately 600 nm.

In one or more embodiments, the bottom resist layer 102 can be comprised of one or more photosensitive materials, having a solubility that can be altered via one or more electron beam doses to define a desired pattern (e.g., to define the fabrication region 110), and/or can be developed via one or more developer solutions. For instance, example photosensitive materials and/or compositions that can be comprised within the bottom resist layer 102 can include, but are not limited to: poly(methylmethacrylate/methacrylic acid) copolymer, a chemically amplified positive tone resist, a combination thereof, and/or the like. In various embodiments, the bottom resist layer 102 can be comprised of one or more lift-off resist materials that can be developed through a dissolving property, without the implementation of one or more electron beam doses. For instance, example lift-off resist materials and/or compositions that can be comprised within the bottom resist layer 102 can include, but are not limited to: polydimethylglutarimide ("PMGI"), a chemically amplified positive tone resist, a combination thereof, and/or the like. For example, the bottom resist layer 102 can be a lift-off resist comprising PMGI that can be patterned using tetramethylammonium hydroxide ("TMAH") as a developer to form the fabrication region 110. Although FIG. 1 depicts the bottom resist layer 102 as a single layer, the architecture of the bottom resist layer 102 is not so limited. For example, the bottom resist layer 102 can comprise a plurality of layers stacked to reach the desired thickness (e.g., along the Y-axis shown in FIG. 1).

As shown in FIG. 1, the middle resist layer 104 can be a second lithographic stencil layer of the three layer lithographic stencil 100. As shown in FIG. 1, the middle resist layer 104 can be patterned to create a first opening 112 (e.g., delineated by dashed lines in FIG. 1) and a second opening 114 (e.g., delineated by dashed lines in FIG. 1) over the fabrication region 110. The middle resist layer 104 can include a bridge portion 116 suspended over the fabrication region 110. The bridge portion 116 can define the first opening 112 and the second opening 114. For example, the first opening 112 and the second opening 114 can be positioned adjacent to, and along the side of, the bridge portion 116. In various embodiments, the first opening 112 can guide the deposition of superconducting material into the fabrication region 110 during a first deposition process in fabricating one or more Josephson junctions. Additionally, the second opening 114 can guide the deposition of superconducting material into the fabrication region 110 during a second deposition process in fabricating the one or more Josephson junctions. The position of the bridge portion 116 (e.g., along the X-axis shown in FIG. 1), and thereby the dimensions of the first opening 112 and/or second opening 114), can vary depending on the deposition angles of the first and second deposition processes and/or the desired geometry of the Josephson junction being fabricated.

In various embodiments, the middle resist layer 104 can have a thickness (e.g., along the Y-axis shown in FIG. 1) ranging from, for example, greater than or equal to 100 nm and less than or equal to 1 micron. For example, the middle resist layer 104 can have an exemplary thickness (e.g., along the Y-axis shown in FIG. 1) of approximately 300 nm. Although FIG. 1 depicts the middle resist layer 104 as a single layer, the architecture of the middle resist layer 104 is not so limited. For example, the middle resist layer 104 can comprise a plurality of layers stacked to reach the desired thickness (e.g., along the Y-axis shown in FIG. 1). Additionally, the stack of layers can include alternating material compositions. For instance, one or more layers of the middle resist layer 104 can include one or more organic compositions while another layer can include one or more inorganic compositions.

In one or more embodiments, the middle resist layer 104 can include one or more positive or negative resist materials. For example, the middle resist layer 104 can be patterned via one or more electron beam doses to define the first opening 112 and/or the second opening 114. Example materials that can be comprised within the middle resist layer 104 can include, but are not limited to: polymethyl methacrylate ("PMMA"), AR-P 6200 (CSAR 62), ZEP520A, a combination thereof, and/or the like. For instance, the middle resist layer 104 can be a positive resist comprising PMMA, where the first opening 112 and/or the second opening 114 are patterned using one or more electron beam doses.

In various embodiments, the top resist layer 106 can be a third lithographic stencil layer of the three layer lithographic stencil 100. As shown in FIG. 1, the top resist layer 106 can be patterned to expose the first opening 112 and/or the second opening 114, and thereby the fabrication region 110. The top resist layer 106 can include a blocking portion 118 positioned on top of the suspended bridge portion 116. The blocking portion 118 have a thickness (e.g., along the Y-axis shown in FIG. 1) sufficient in size so as to shield at least the second opening 114 from being coated by superconducting material during a deposition process. For example, the deposition process can deposit superconducting material at an angle, where the thickness (e.g., along the Y-axis shown in FIG. 1) of the blocking portion 118 can be based on the size of the second opening 114 and/or the angle at which the middle resist layer 104 (e.g., the second opening 114) is exposed to the deposition process.

As described in various embodiments described herein, the first deposition process in fabricating one or more Josephson junctions within the fabrication region 110 can be performed at an angle. As such, absent the presence of the top resist layer 106, some of the superconducting material can travel into the second opening 114 at the defined deposition angle and coat an inside portion of the second opening 114 (e.g., coat a side wall of middle resist layer 104 that defines the second opening 114). As result of the coating the inside of the second opening 114, the dimensions the second opening 114 can become distorted.

However, the blocking portion 118 can prevent distortion of the second opening 114 by shielding the opening from the angled deposition. For example, the blocking portion 118 can have a thickness (e.g., along the Y-axis shown in FIG. 1) such that a shadow of the blocking portion 118, when cast in accordance with the deposition angle of the first deposition process, covers the second opening 114. Therefore, the thickness of the top resist layer 106, and thereby the blocking portion 118, can depend on at least the dimensions of the second opening 114 and/or the deposition angle of the first deposition process. In various embodiments, the top resist layer 106 can have a thickness (e.g., along the Y-axis shown in FIG. 1) ranging from, for example, greater than or equal to 100 nm and less than or equal to 1 micron. For example, the top resist layer 106 can have an exemplary thickness (e.g., along the Y-axis shown in FIG. 1) of approximately 500 nm. Although FIG. 1 depicts the top resist layer 106 as a single layer, the architecture of the top resist layer 106 is not so limited. For example, the top resist layer 106 can comprise a plurality of layers stacked to reach the desired thickness (e.g., along the Y-axis shown in FIG. 1). Additionally, the stack of layers can include alternating material compositions. For instance, one or more layers of the top resist layer 106 can include one or more organic compositions while another layer can include one or more inorganic compositions.

In one or more embodiments, the top resist layer 106 can include one or more positive or negative resist materials. For example, the top resist layer 106 can be patterned via one or more electron beam doses to define openings corresponding to the first opening 112 and/or second opening 114, and thereby define the blocking portion 118. Example materials that can be comprised within the top resist layer 106 can include, but are not limited to: methyl methacrylate ("MMA"), poly(methylmethacrylate/methacrylic acid) ("MMA/MAA" copolymer) other positive tone resist materials (e.g., case in a solvent, such as ethyl lactate, that does not dissolve the middle resist layer 104)), a combination thereof, and/or the like. For instance, the top resist layer 106 can be a positive resist comprising MMA/MAA copolymer, where the blocking portion 118 is patterned using one or more electron beam doses.

As shown in FIG. 1, the top resist layer 106 can be set back from the perimeter of the first opening 112 and/or the second opening 114 by a setback distance S (e.g., at least one setback distance S along the perimeter is delineated by dashed-dotted lines in FIG. 1). In various embodiments, the setback distance S can be a product of varying sensitivity between the middle resist layer 104 and the top resist layer 106 to the one or more electron beam doses implemented to pattern the first opening 112 and/or the second opening 114. In one or more embodiments, the top resist layer 106 can be further patterned to establish a defined setback distance S. The setback distance S can be such that superconducting material coated onto the side surface of the top resist layer 106 during the first deposition process will not impede and/or otherwise interfere with the deposition angle of the second deposition process with regards to at least the second opening 114. For example, the setback distance S can be large enough such that residual superconducting material coated onto a side surface of the top resist layer 106 (e.g., a side surface facing towards the second opening 114) will not impede the deposition of superconducting material being deposited through the second opening 114 during the second deposition process. The setback distance S can be, for example, greater than or equal to 20 nm and less than or equal to 300 nm.

FIG. 1 depicts and embodiment of the three layer stencil 100 in which the top resist layer 106 is positioned adjacent to the fabrication region 110 (e.g., along the X-axis shown in FIG. 1) and above the fabrication region 110 (e.g., along the Y-axis shown in FIG. 1). In one or more embodiments, the top resist layer 106 can be selectively positioned onto designated portions of the middle resist layer 104. For example, the top resist layer 106 can be comprised of just the blocking portion 118 and can be positioned just on the bridge portion 116.

Figure 2:
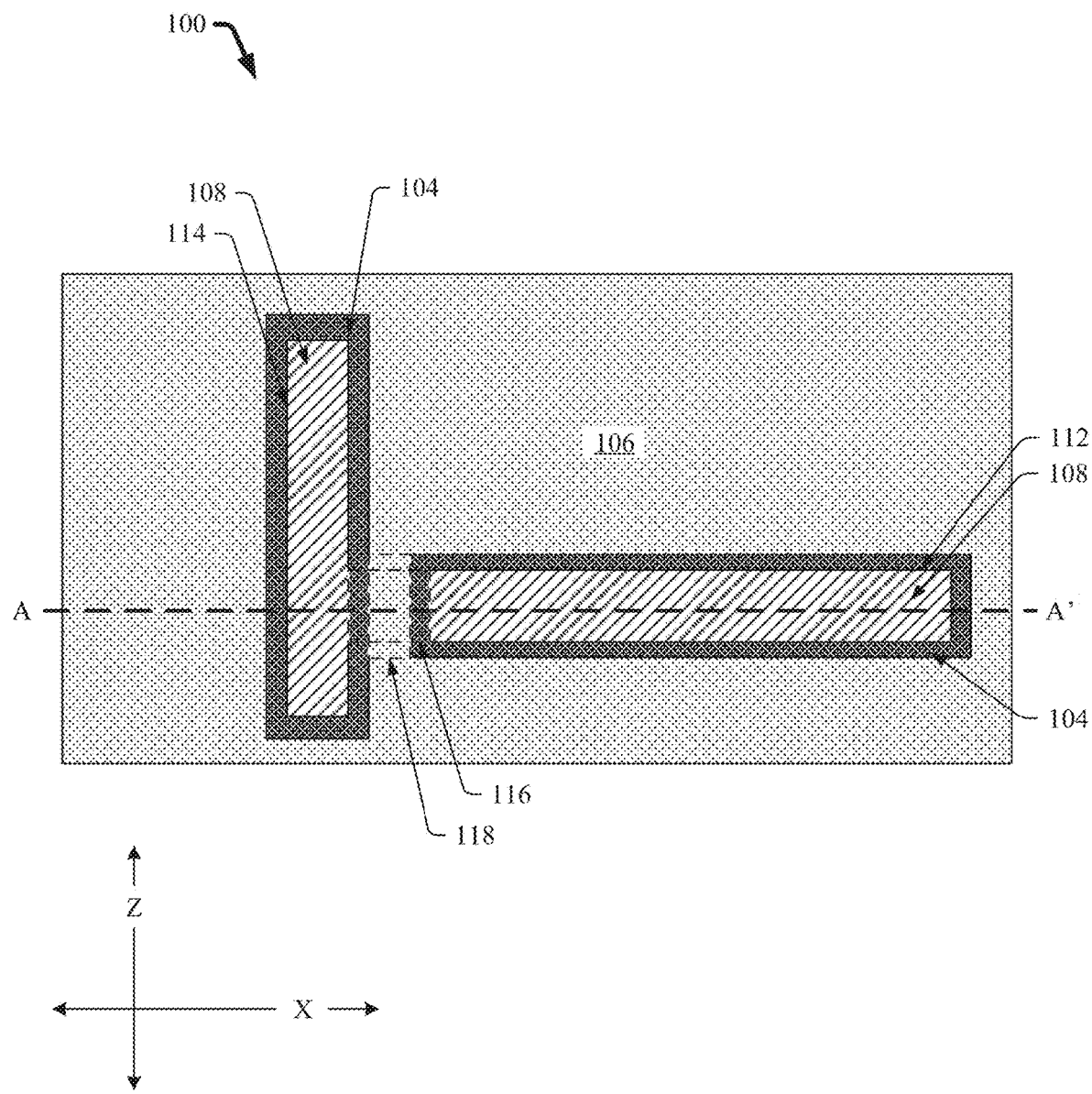
FIG. 2 illustrates a diagram of an example, non-limiting top-down view of a three layer lithographic stencil structure that can be utilized in fabricating one or more Josephson junctions in accordance with one or more embodiments described herein.

FIG. 2 illustrates a diagram of an example, non-limiting top-down view of the three layer lithographic stencil 100 in accordance with one or more embodiments described herein. Repetitive description of like elements employed in other embodiments described herein is omitted for sake of brevity. FIG. 2 exemplifies that the top resist layer 106 can be patterned to expose the first opening 112 and/or the second opening 114, thereby also exposing the fabrication region 110. Additionally, FIG. 2 exemplifies that the bridge portion 116 of the middle resist layer 104 and/or the blocking portion 118 of the top resist layer 106 can be suspended over the fabrication region 110.

As shown in FIG. 2, the first opening 112 and the second opening 114 can extend in substantially perpendicular directions over the fabrication region 110. Further, the bridge portion 116 and blocking portion 118 can be suspended over the fabrication region 110 and between the first opening 112 and second opening 114. For example, the A-A' plane delineated in FIG. 2 can indicate the position of the cross-sectional view depicted in FIG. 1, where the fabrication region 110 extends below the bridge portion 116 and blocking portion 118 along the X-axis shown in FIG. 2 and is accessible via the first opening 112 and/or second opening 114.

While FIG. 2 depicts an exemplary patterning of the three layer stencil 100, the architecture of the three layer stencil 100 is not so limited. Various embodiments of the three layer stencil 100 comprising alternate patterns are also envisaged. For example, the dimensions and/or orientation of the first opening 112 and/or second opening 114 can vary depending on the desired geometry, layout, and/or function of the Josephson junction-based circuitry being fabricated.

Figure 3:
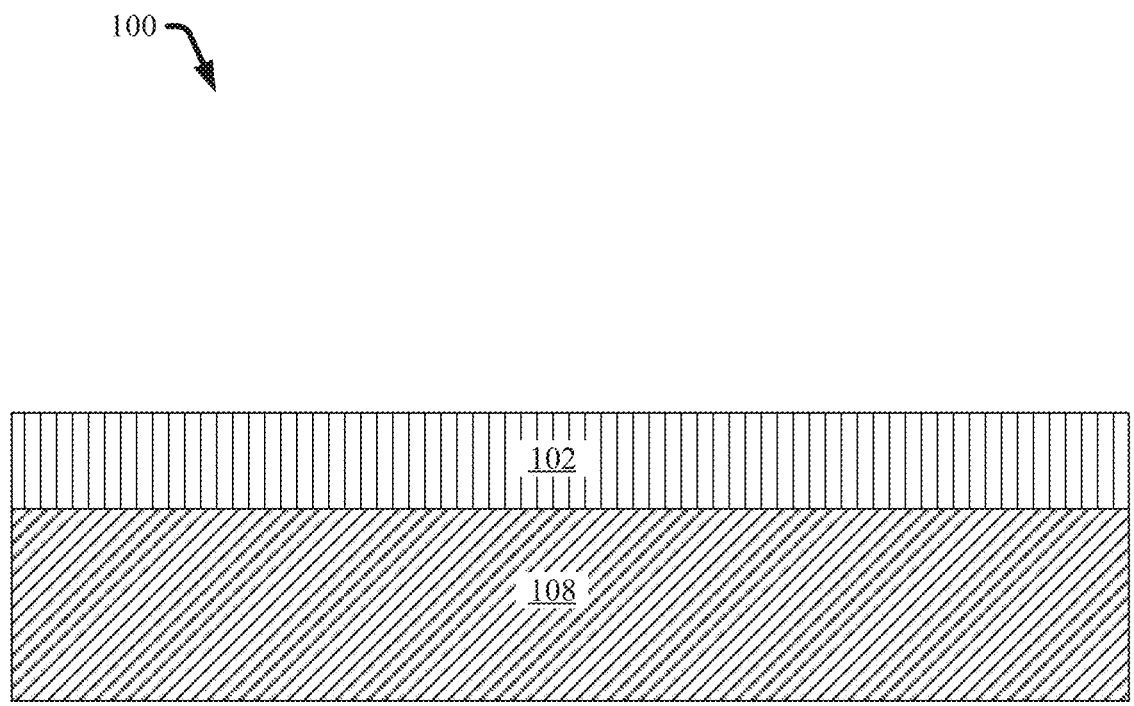
FIG. 3 illustrates a diagram of an example, non-limiting three layer lithographic stencil structure during a first stage of manufacturing in accordance with one or more embodiments described herein.
Figure 3:
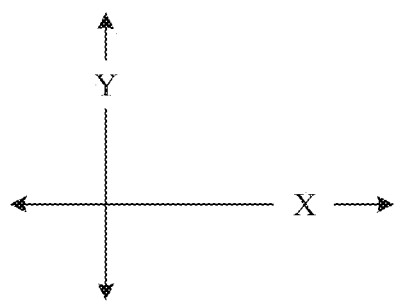

FIG. 3 illustrates a diagram of the example, non-limiting lithographic stencil 100 during a first stage of a lithography process for fabricating the lithographic stencil 100 and/or one or more Josephson junctions in accordance with one or more embodiments described herein. Repetitive description of like elements employed in other embodiments described herein is omitted for sake of brevity. During the first stage of the lithography process, the bottom resist layer 102 can be deposited onto the semiconductor substrate 108.

The bottom resist layer 102 can be deposited onto the semiconductor substrate 108 via one or more deposition processes (e.g., a spin coating deposition process). As shown in FIG. 3, the bottom resist layer 102 can be deposited uniformly onto the semiconductor substrate 108. For example, the bottom resist layer 102 can have substantially the same thickness (e.g., along the Y-axis shown in FIG. 3) across the semiconductor substrate 108. Subsequent to the deposition process, the bottom resist layer 102 can be baked to remove one or more solvents and/or achieve a final thickness (e.g., along the Y-axis shown in FIG. 3). An exemplary baking temperature for the bottom resist layer 102 can range from greater than or equal to 100 degrees Celsius (° C.) and less than or equal to 220° C. Further, the bottom resist layer 102 can be baked for a time period ranging, for example, from greater than or equal to 30 seconds and less than or equal to 1 hour. For example, the bottom resist layer 102 can be PMGI deposited onto the semiconductor substrate 108 and baked at 170° C. for 5 minutes to achieve an exemplary thickness of 600 nm.

Figure 4:
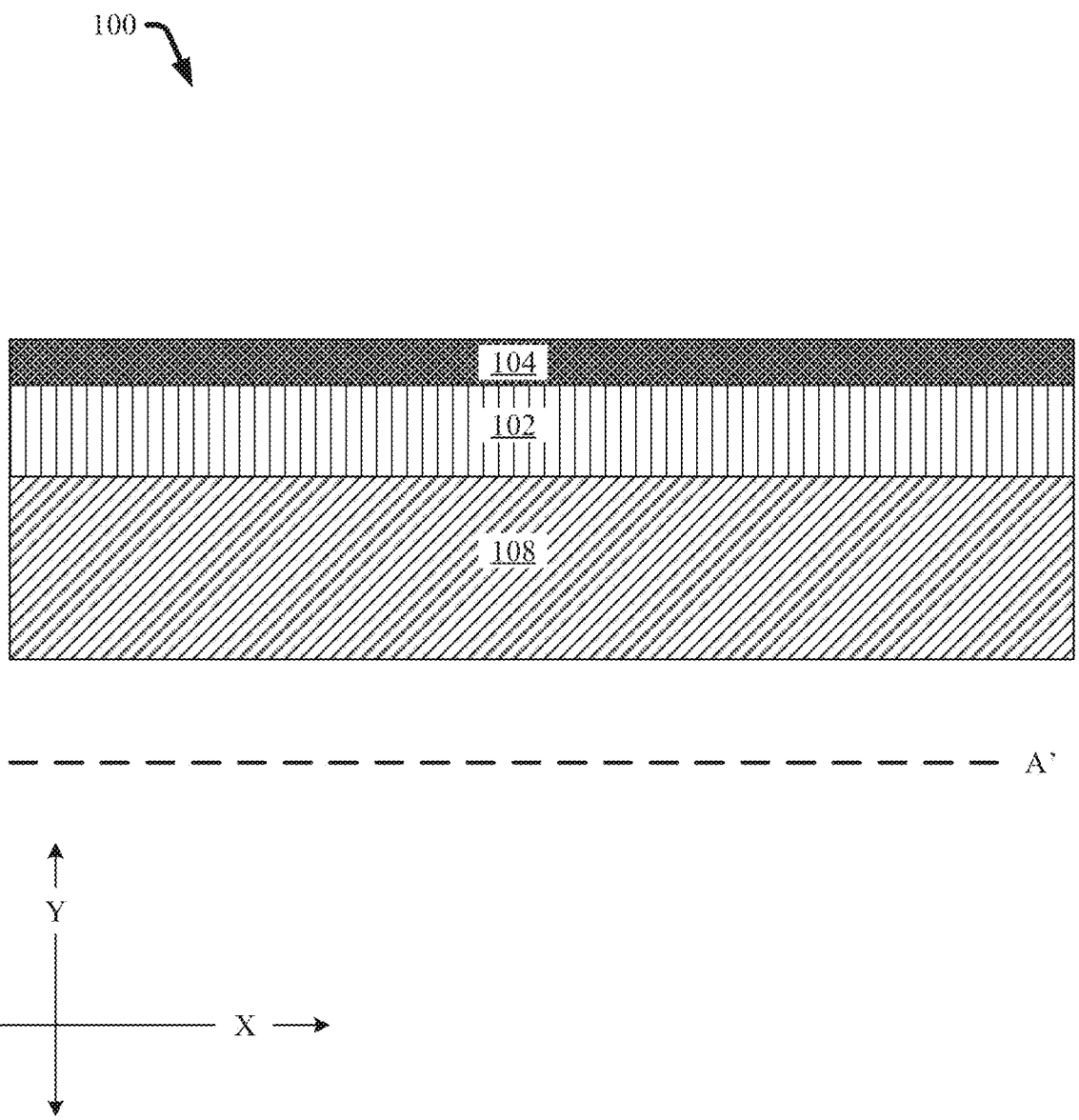
FIG. 4 illustrates a diagram of an example, non-limiting three layer lithographic stencil structure during a second stage of manufacturing in accordance with one or more embodiments described herein.

FIG. 4 illustrates a diagram of the example, non-limiting lithographic stencil 100 during a second stage of a lithography process for fabricating the lithographic stencil 100 and/or one or more Josephson junctions in accordance with one or more embodiments described herein. Repetitive description of like elements employed in other embodiments described herein is omitted for sake of brevity. During the second stage of the lithography process, the middle resist layer 104 can be deposited onto the bottom resist layer 102.

The middle resist layer 104 can be deposited onto the bottom resist layer 102 via one or more deposition processes (e.g., a spin coating deposition process). As shown in FIG. 4, the middle resist layer 104 can be deposited uniformly onto the bottom resist layer 102. For example, the middle resist layer 104 can have substantially the same thickness (e.g., along the Y-axis shown in FIG. 4) across the bottom resist layer 102. Further, the middle resist layer 104 can be cast in one or more solvents during the deposition process of the second stage of manufacturing, where the bottom resist layer 102 is not soluble with regards to solvent used to cast the middle resist layer 104. Example solvents that can be used to cast the middle resist layer 104 can include, but are not limited to: anisole, ethyl lactate, methyl isobutyl ketone ("MIBK"), chlorobenzene, a combination thereof, and/or the like.

Subsequent to the deposition process, the middle resist layer 104 can be baked to remove one or more solvents and/or achieve a final thickness (e.g., along the Y-axis shown in FIG. 4). An exemplary baking temperature for the middle resist layer 104 can range from greater than or equal to 100° C. and less than or equal to 200° C. Further, the middle resist layer 104 can be baked for a time period ranging, for example, from greater than or equal to 30 seconds and less than or equal to 1 hour. For example, the middle resist layer 104 can be PMMA deposited onto the bottom resist layer 102 and baked at 170° C. for 5 minutes to achieve an exemplary thickness of 300 nm.

Figure 5:
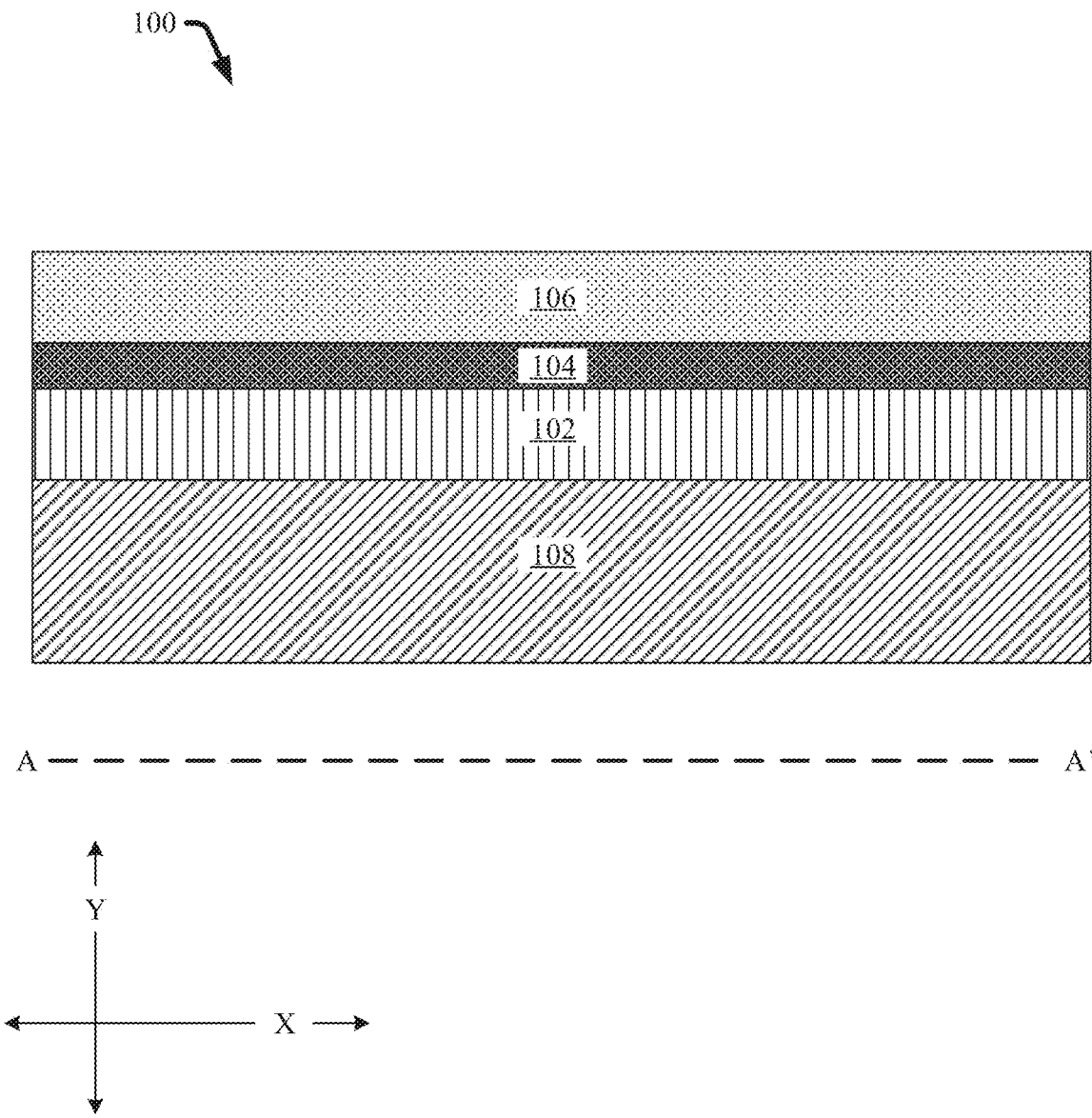
FIG. 5 illustrates a diagram of an example, non-limiting three layer lithographic stencil structure during a third stage of manufacturing in accordance with one or more embodiments described herein.

FIG. 5 illustrates a diagram of the example, non-limiting lithographic stencil 100 during a third stage of a lithography process for fabricating the lithographic stencil 100 and/or one or more Josephson junctions in accordance with one or more embodiments described herein. Repetitive description of like elements employed in other embodiments described herein is omitted for sake of brevity. During the third stage of the lithography process, the top resist layer 106 can be deposited onto the middle resist layer 104.

The top resist layer 106 can be deposited onto the middle resist layer 104 via one or more deposition processes (e.g., a spin coating deposition process). As shown in FIG. 5, the top resist layer 106 can be deposited uniformly onto the middle resist layer 104. For example, the top resist layer 106 can have substantially the same thickness (e.g., along the Y-axis shown in FIG. 5) across the middle resist layer 104. In one or more embodiments, the top resist layer 106 can be selectively deposited onto a portion of middle resist layer 104. For example, the top resist layer 106 can be selectively deposited onto just a portion of the middle resist layer 104 that will be formed into the bridge portion 116. Further, the middle resist layer 104 can be cast in one or more solvents during the deposition process of the third stage of manufacturing, where the middle resist layer 104 is not soluble with regards to solvent used to cast the top resist layer 106. Example solvents that can be used to cast the top resist layer 106 can include, but are not limited to: ethyl lactate, MIBK, a combination thereof, and/or the like.

Subsequent to the deposition process, the top resist layer 106 can be baked to remove one or more solvents and/or achieve a final thickness (e.g., along the Y-axis shown in FIG. 5). An exemplary baking temperature for the top resist layer 106 can range from greater than or equal to 100° C. and less than or equal to 200° C. Further, the top resist layer 106 can be baked for a time period ranging, for example, from greater than or equal to 30 seconds and less than or equal to 30 minutes. For example, the top resist layer 106 can be MMA deposited onto the middle resist layer 104 and baked at 170° C. for 5 minutes to achieve an exemplary thickness of 500 nm.

Figure 6:
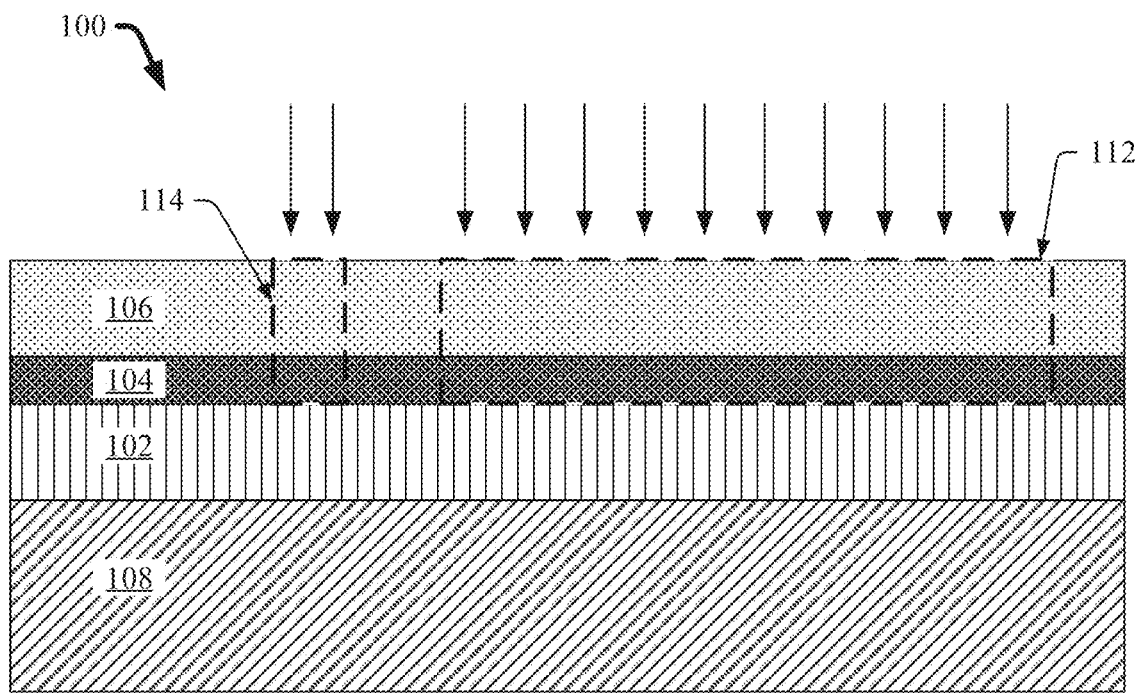
FIG. 6 illustrates a diagram of an example, non-limiting three layer lithographic stencil structure during a fourth stage of manufacturing in accordance with one or more embodiments described herein.
Figure 6:
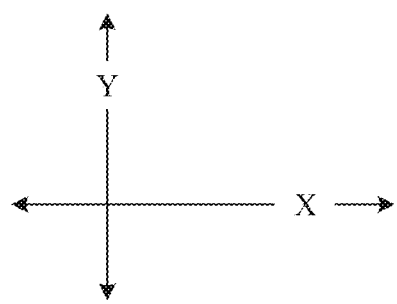

FIG. 6 illustrates a diagram of the example, non-limiting lithographic stencil 100 during a fourth stage of a lithography process for fabricating the lithographic stencil 100 and/or one or more Josephson junctions in accordance with one or more embodiments described herein. Repetitive description of like elements employed in other embodiments described herein is omitted for sake of brevity. During the fourth stage of the lithography process, the top resist layer 106 and/or the middle resist layer 104 can be exposed to one or more electron beam doses to pattern the first opening 112 and/or the second opening 114.

The one or more electron beam doses can be represented in FIG. 6 by a plurality of downward arrows selectively positioned to treat regions of the top resist layer 106 and/or the middle resist layer 104 corresponding to the future location of the first opening 112 and/or second opening 114. One or more characteristics of the one or more electron beam doses can depend on the material composition and/or thickness of the top resist layer 106 and/or the middle resist layer 104. For example, an electron beam dose of between 50 and 2500 micro Coulombs per square centimeter can be implemented with regards to an electron beam energy of 100 kilovolts (kV), and/or proportionally lower doses can be employed for lower electron beam energies. For instance, where the middle resist layer 104 comprises PMMA, the one or more electron beam doses can be between 1000 and 2500 micro Coulombs per square centimeter. The one or more electron beam doses can alter the solubility of the selected portions (e.g., portions delineated by dashed lines in FIG. 6 and corresponding to the first opening 112 and/or the second opening 114) of the top resist layer 106 and/or the middle resist layer 104.

Figure 7:
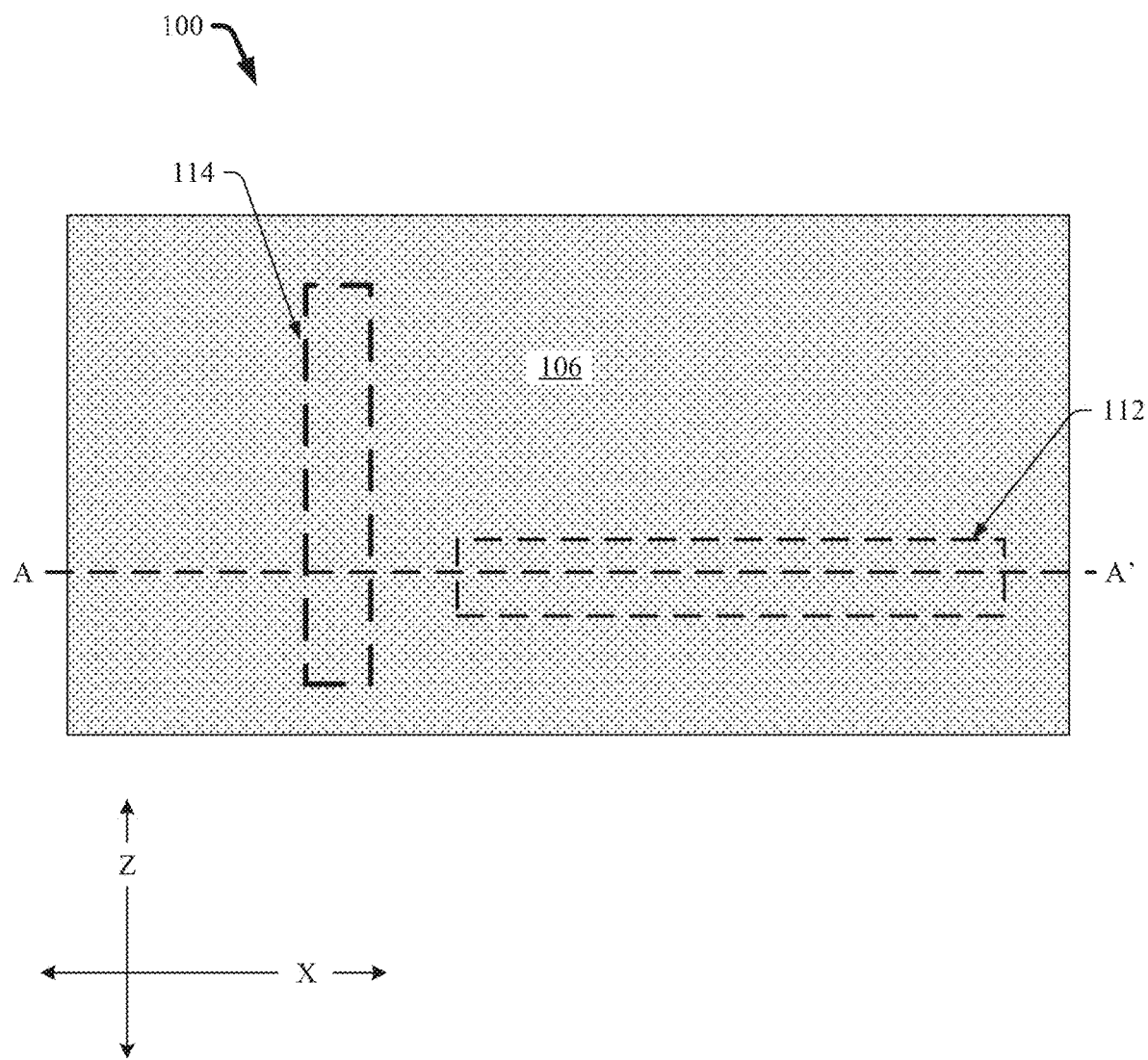
FIG. 7 illustrates a diagram of an example, non-limiting top-down view of a three layer lithographic stencil structure during the fourth stage of manufacturing in accordance with one or more embodiments described herein.

FIG. 7 illustrates a diagram of an example, non-limiting top-down view of the lithographic stencil 100 during the fourth stage of a lithography process for fabricating the lithographic stencil 100 and/or one or more Josephson junctions in accordance with one or more embodiments described herein. Repetitive description of like elements employed in other embodiments described herein is omitted for sake of brevity. The dashed lines depicted in FIG. 7 delineate the regions of the top resist layer 106 to be subjected to the one or more electron beam doses to achieve the patterning depicted in FIG. 2. For example, the top-down view depicted in FIG. 7 exemplifies that the electron beam doses can be selectively applied to positions on the top resist layer 106 that correspond to the desired location and/or geometry of the first opening 112 and/or second opening 114. As described in various embodiments herein, the electron beam dose patterns depicted in FIG. 7 are exemplary. Alternate patterning configurations can be achieved via electron beam doses in accordance with one or more embodiments described herein.

Figure 8:
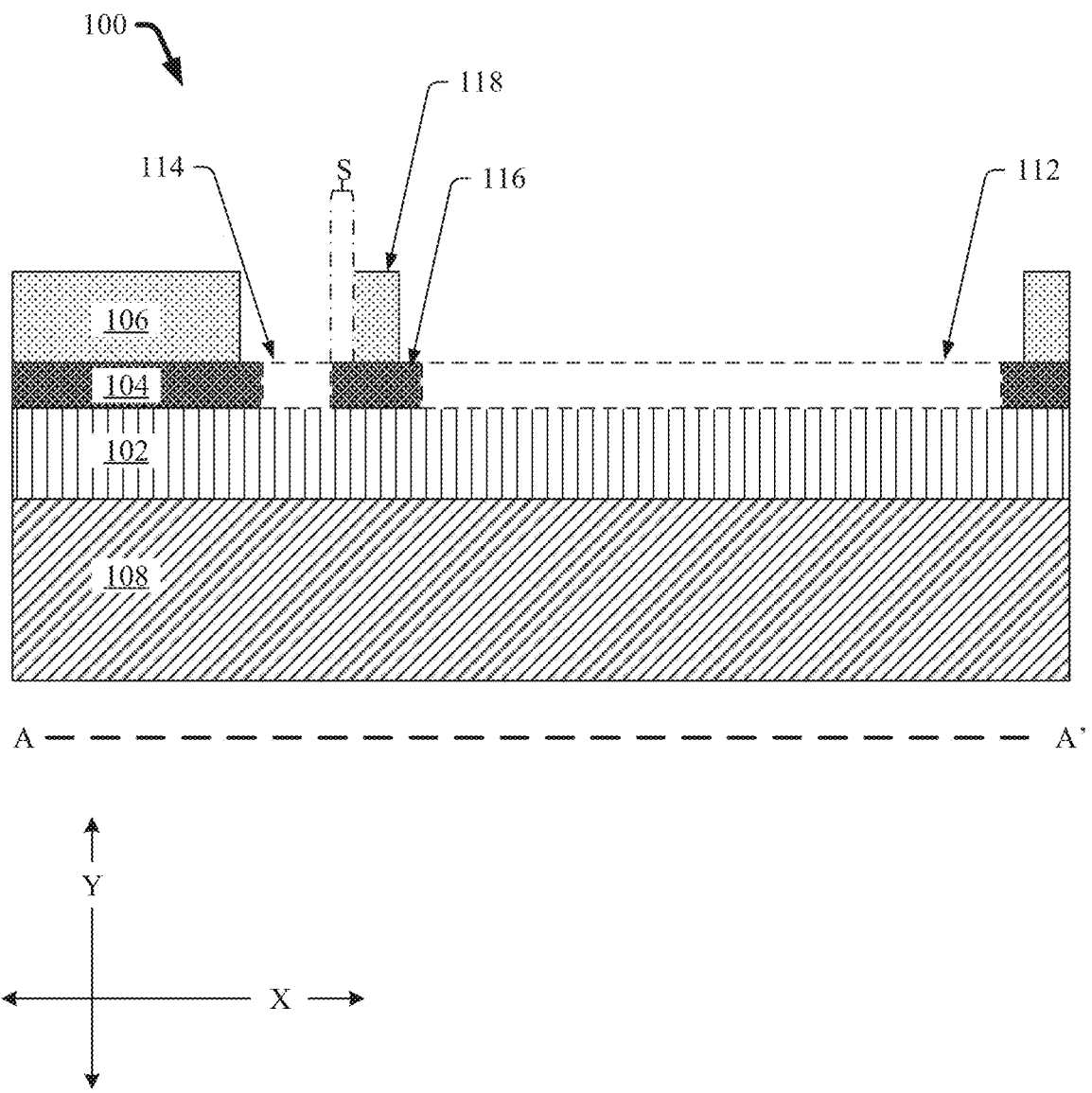
FIG. 8 illustrates a diagram of an example, non-limiting three layer lithographic stencil structure during a fifth stage of manufacturing in accordance with one or more embodiments described herein.

FIG. 8 illustrates a diagram of the example, non-limiting lithographic stencil 100 during a fifth stage of the lithography process for fabricating the lithographic stencil 100 and/or one or more Josephson junctions in accordance with one or more embodiments described herein. Repetitive description of like elements employed in other embodiments described herein is omitted for sake of brevity. During the fifth stage of the lithography process, the top resist layer 106 and/or the middle resist layer 104 can be developed to form the first opening 112 and/or the second opening 114.

The electron beam treated top resist layer 106 and/or middle resist layer 104 can be subjected to one or more developer solutions to remove one or more portions defined by the electron beam dose at the fourth stage of the lithography process. As shown in FIG. 8, the developer solution can remove portions of the top resist layer 106 and/or middle resist layer 104 exposed to the one or more electron beam doses and corresponding to the first opening 112 and/or second opening 114. For example, the portions of the top resist layer 106 and/or middle resist layer 104 can be removed by the same developer solution. Example developers that can be comprised within the developer solution can include, but are not limited to: isopropyl alcohol, MIBK, a mixture of isopropyl alcohol and water, a combination thereof, and/or the like. Additionally, the top resist layer 106 and/or middle resist layer 104 can be developed at a temperature ranging, for example, from greater than or equal to 0° C. and less than or equal to 25° C. For example, the developer solution can be a mixture of 1 part water to 3 parts isopropyl alcohol at 3° C.

As described in various embodiments described herein, the top resist layer 106 can be more sensitive to the one or more electron beam doses than the middle resist layer 104. At least due to the increased electron beam sensitivity, the effected area of the top resist layer 106 can expand beyond the boundaries of the effected area of the middle resist layer 104 despite a fixed location of the one or more electron beam doses. Thereby, when the developer solution removes the effected areas, an edge of the top resist layer 106 can be recessed from an edge of the middle resist layer 104 by the setback distance S. Thus, the first opening 112 and/or the second opening 114 can be predominantly defined by the middle resist layer 104.

Subsequent to forming the first opening 112 and/or the second opening 114 by developing the top resist layer 106 and/or middle resist layer 104, the lithography process can pattern the bottom resist layer 102 to form the fabrication region 110 and achieve the structure depicted in FIG. 1. In one or more embodiments, the bottom resist layer 102 can be patterned using a solvent. The solvent can be applied to the bottom resist layer 102 through the first opening 112 and/or the second opening 114 and can dissolve the exposed portions of the bottom resist layer 102 to form the fabrication region 110. Further, the middle resist layer 104 and/or the top resist layer 106 can be insoluble with regards to the solvent employed to develop the bottom resist layer 102. Advantageously, the bottom resist layer 102 can thereby be patterned without diminishing the thickness (e.g., along the Y-axis of FIG. 8) of the bridge portion 116. Example solvents can include, but are not limited to: TMAH, isopropyl alcohol (e.g., mixed with water or MIBK), a combination thereof, and/or the like. For example, where the bottom resist layer 102 is a lift-off resist, the bottom resist layer 102 can be patterned using TMAH to dissolve exposed portions of the bottom resist layer 102 to form the fabrication region 110.

FIGS. 3-8 illustrate a lithography process in which the bottom resist layer 102 is a lift-off resist; however, various embodiments in which the bottom resist layer 102 is a photosensitive material are also envisaged. For example, the bottom resist layer 102 can be comprised of a material that can be patterned via one or more electron beam doses. For instance, the bottom resist layer 102 can be comprised of a material that can be patterned via the same electron beam doses employed to pattern the top resist layer 106 and/or middle resist layer 104. Additionally, the bottom resist layer 102 can be developed via the same developer solution employed to develop the top resist layer 106 and/or the middle resist layer 104.

In one or more embodiments, the bottom resist layer 102 can be patterned via one or more etching processes. For example, regions of the bottom resist layer 102 that are exposed via the first opening 112 and/or the second opening 114 can be removed via one or more etching processes to form the fabrication region 110. Additionally, in various embodiments, one or more portions of the top resist layer 106 can be removed via one or more etching processes. For example, the top resist layer 106 can be etched to remove one or more portions other than the blocking portion 118.

Figure 9:
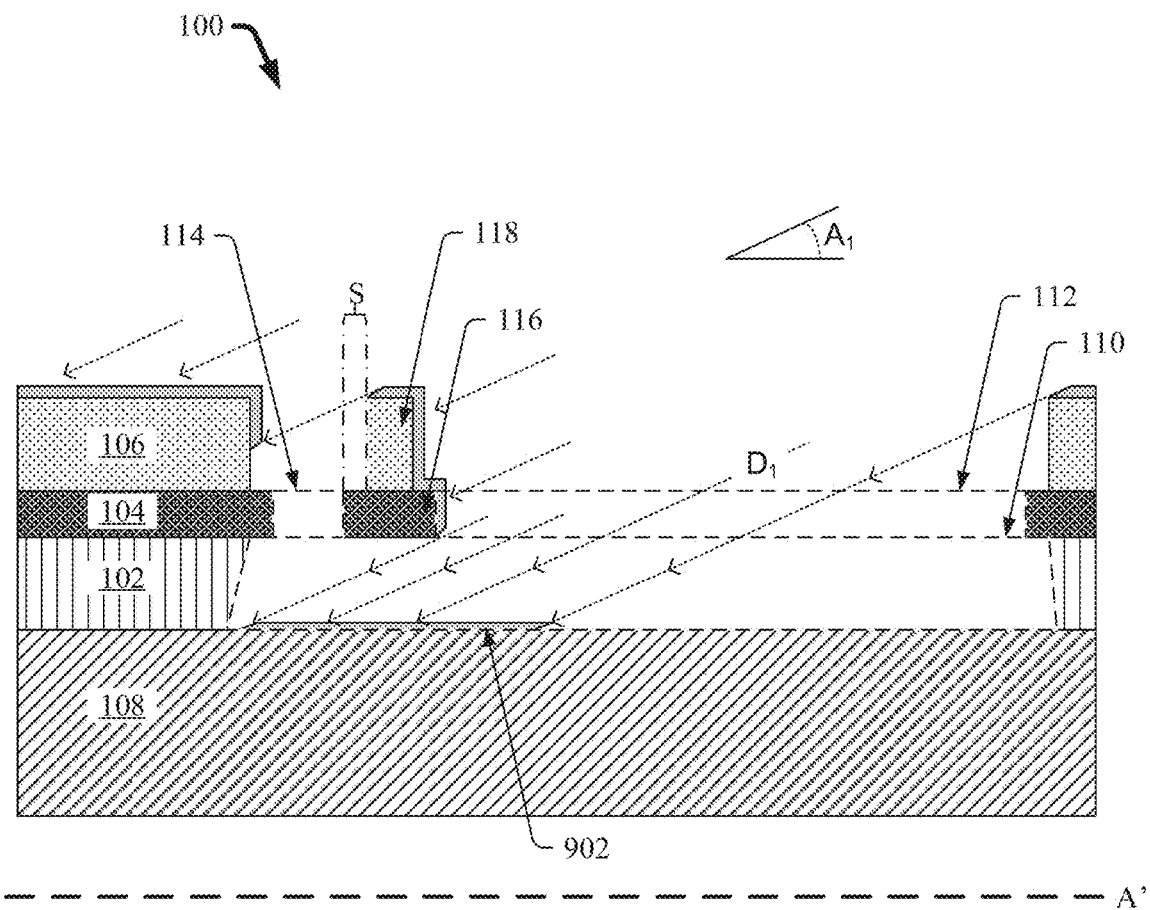
FIG. 9 illustrates a diagram of an example, non-limiting first superconducting material deposition of a lithography process for fabricating one or more Josephson junctions in accordance with one or more embodiments described herein.

FIG. 9 illustrates an example, non-limiting first deposition process $D_1$ that can be employed with the three layer lithographic stencil 100 to fabricate one or more Josephson junctions in accordance with one or more embodiments described herein. Repetitive description of like elements employed in other embodiments described herein is omitted for sake of brevity. In various embodiments, the first deposition process $D_1$ can be a deposition process that deposits a first superconducting material 902 into the fabrication region 110. Example materials that can be comprised within the first superconducting material 902 can include, but are not limited to: niobium, aluminum, vanadium, titanium, tantalum, titanium nitride, niobium nitride, a combination thereof, and/or the like. For instance, the first superconducting material 902 can be aluminum. The first superconducting material 902 can have a thickness (e.g., along the Y-axis shown in FIG. 9) ranging, for example, from greater than or equal to 5 nm and less than or equal to 100 nm. For instance, the first superconducting material 902 can have a thickness of 30 nm within the fabrication region 110.

The first deposition process $D_1$ can be represented by the dotted arrows shown in FIG. 9. Also shown in FIG. 9, the first deposition process $D_1$ can be employed at first deposition angle $A_1$ with respect to the semiconductor substrate 108. For example, the first deposition angle $A_1$ can be an angle at which the middle resist layer 104 is exposed to the first deposition process $D_1$. The first deposition angle $A_1$ can be, for example, greater than or equal to 20 degrees and less than or equal to 60 degrees. For example, the first deposition angle $A_1$ can be 45 degrees. At least due to the first deposition angle $A_1$, the first deposition process $D_1$ can deposit the first superconducting material 902 through the first opening 112 and into a position within the fabrication region 110 that extends below the second opening 114 (e.g., as shown in FIG. 9).

During the first deposition process $D_1$ the first opening 112 can be coated with the first superconducting material 902. For example, a side surface of the bridge portion 116 that defines the first opening 112 can be coated with the first superconducting material 902 (e.g., as shown in FIG. 9). However, the blocking portion 118 can shield the second opening 114 from being coated with the first superconducting material 902 (e.g., as shown in FIG. 9). For example, a side surface of the blocking portion 118 that faces the first opening 112 can shield the second opening 114 from the first deposition process $D_1$ and thereby become coated with the first superconducting material 902 (e.g., as shown in FIG. 9). In accordance with various embodiments described herein, the blocking portion 118 can have a thickness based on the first deposition angle $A_1$ such that the blocking portion 118 can cast a shadow that covers the second opening 114 when facing the first deposition angle $A_1$. Advantageously, the dimensions of the second opening 114 can remain free, or substantially free, from distortion during the first deposition process $D_1$ due to the shielding providing by the blocking portion 118.

Figure 10:
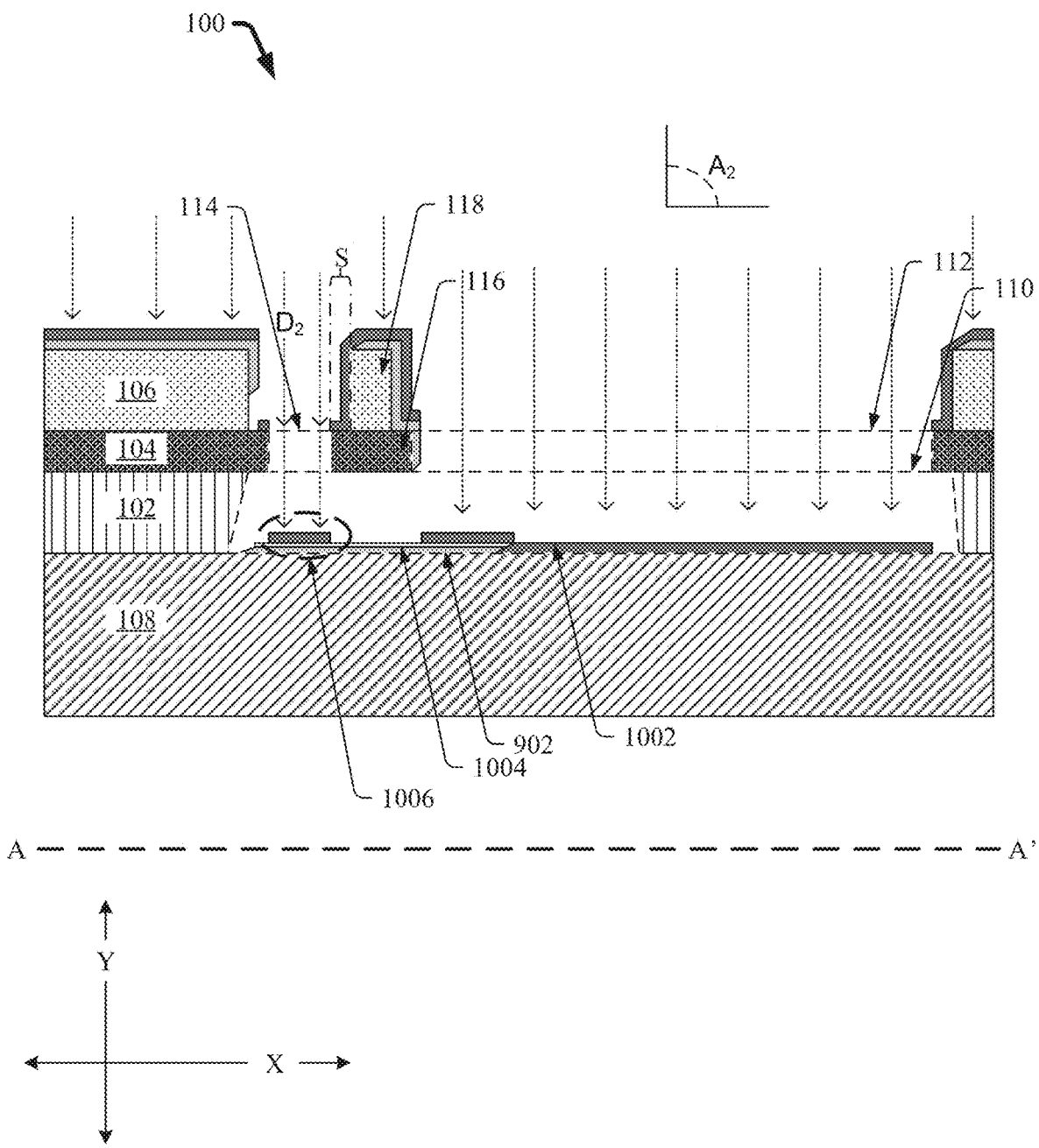
FIG. 10 illustrates a diagram of an example, non-limiting second superconducting material deposition of a lithography process for fabricating one or more Josephson junctions in accordance with one or more embodiments described herein.

FIG. 10 illustrates an example, non-limiting second deposition process $D_2$ that can be employed with the three layer lithographic stencil 100 to fabricate one or more Josephson junctions in accordance with one or more embodiments described herein. Repetitive description of like elements employed in other embodiments described herein is omitted for sake of brevity. In various embodiments, the second deposition process $D_2$ can be a deposition process that deposits a second superconducting material 1002 into the fabrication region 110.

Example materials that can be comprised within the second superconducting material 1002 can include, but are not limited to: niobium, aluminum, vanadium, titanium, tantalum, titanium nitride, niobium nitride, a combination thereof, and/or the like. For instance, the second superconducting material 1002 can be aluminum. In various embodiments, the first superconducting material 902 and the second superconducting material 1002 can have same, or substantially the same, composition or a different composition. The second superconducting material 1002 can have a thickness (e.g., along the Y-axis shown in FIG. 10) ranging, for example, from greater than or equal to 30 nm and less than or equal to 150 nm. For instance, the second superconducting material 1002 can have a thickness of 80 nm within the fabrication region 110.

As shown in FIG. 10, between the first deposition process $D_1$ and the second deposition process $D_2$ an insulating layer 1004 can be formed on the first superconducting material 902. For example, the first superconducting material 902 can be oxidized to form the insulating layer 1004. For instance, the insulating layer 1004 can be a metal oxide formed from the first superconducting material 902, such as aluminum oxide. The insulating layer 1004 can have a thickness (e.g., along the Y-axis shown in FIG. 10) ranging, for example, from greater than or equal to 0.8 nm and less than or equal to 2 nm. For instance, the insulating layer 1004 can have a thickness of 1.2 nm within the fabrication region 110.

The second deposition process $D_2$ can be represented by the dotted arrows shown in FIG. 10. Also shown in FIG. 10, the second deposition process $D_2$ can be employed at second deposition angle $A_2$ with respect to the semiconductor substrate 108. The second deposition angle $A_2$ can be, for example, greater than or equal to 90 degrees and less than or equal to 60 degrees. For example, the first deposition angle $A_2$ can be 90 degrees (e.g., as shown in FIG. 10). The second deposition process $D_2$ can deposit the second superconducting material 1002 through the first opening 112 and the second opening 114 into the fabrication region 110. For example, the second deposition process $D_2$ can deposit the second superconducting material 1002 through the second opening 114 and onto the insulating layer 1004 to form at least one Josephson junction structure 1006. For instance, the Josephson junction structure 1006 can include a stack of the first superconducting material 902, the insulating layer 1004, and the second superconducting material 1002; where the insulating layer 1004 can serve as a tunnel barrier.

As shown in FIG. 10, the setback distance S can prevent the first superconducting material 902 coated onto the top resist layer 106 during the first deposition process $D_1$ from interfering with the second deposition process's $D_2$ depositing through the second opening 114. For example, the first deposition process $D_1$ can coat a side surface of the top resist layer 106 that faces toward the second opening 114 (e.g., as shown in FIG. 10). However, in various embodiments the setback distance S can be greater than the thickness (e.g., along the X-axis shown in FIG. 10) of the first superconducting material 902 coated on the top resist layer 106 side surface. Thereby, the residual first superconducting material 902 coated on the top resist layer 106 side surface can be recessed away from the perimeter of the second opening 114. Further, the recessed positioning of the residual first superconducting material 902 coated on the top resist layer 106 side surface can ensure that the first superconducting material 902 does not interfere with the second deposition process's $D_2$ access to the second opening 114. Thereby, depositing the second superconducting material 1002 into the fabrication region 110 can be guided predominately by the second opening 114 rather than by a coating of the first superconducting material 902 (e.g., can be guided predominately by the dimensions of the second opening 114, free from distortion by coated first superconducting material 902).

In various embodiments, the blocking portion 118 can shield the second opening 114 during the first deposition process $D_1$. Also, the setback distance S can recess the first superconducting material 902 coated onto the top resist layer 106 away from the perimeter of at least the second opening 114. Thereby, the second deposition process $D_2$ can be guided by the dimensions of the second opening 114 free from interference from residual first superconducting material 902.

Figure 11:
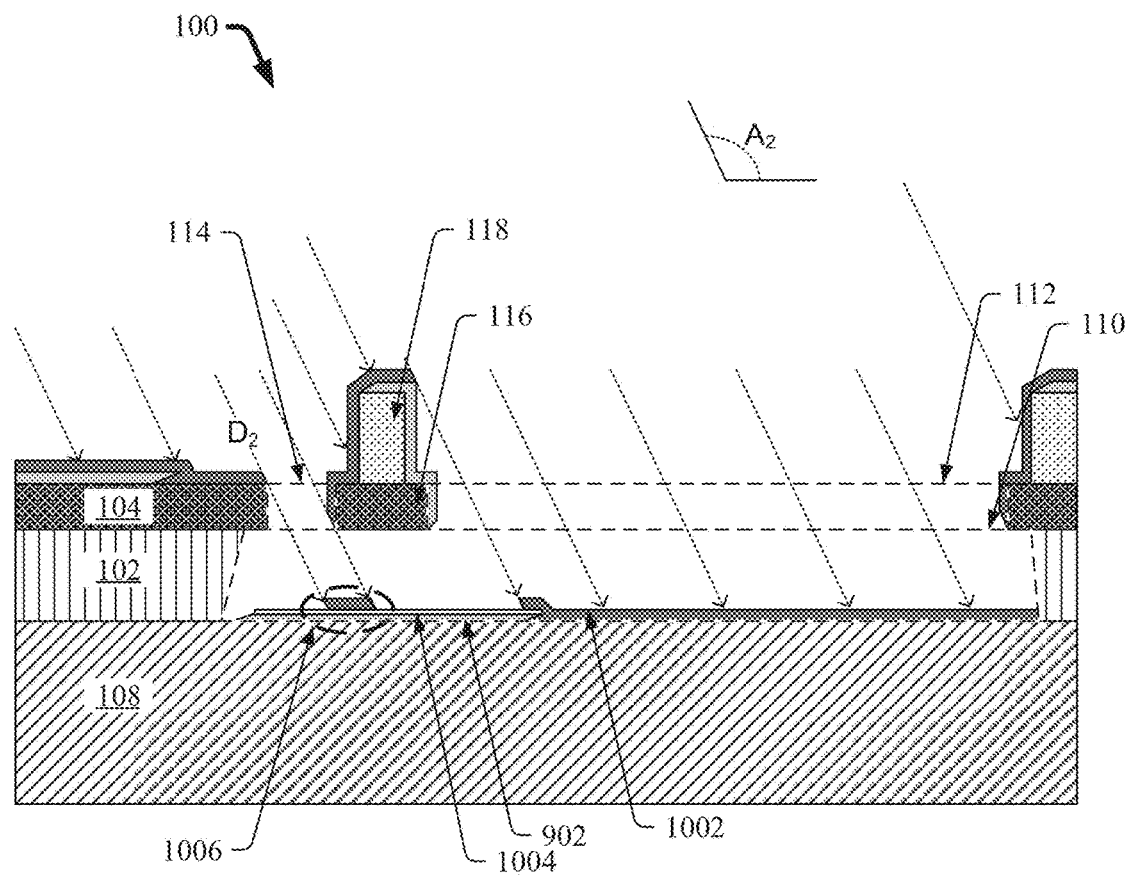
FIG. 11 illustrates a diagram of an example, non-limiting second superconducting material deposition of a lithography process for fabricating one or more Josephson junctions in accordance with one or more embodiments described herein.

FIG. 11 illustrates a diagram of the example, non-limiting second deposition process $D_2$ that can be employed with the three layer lithographic stencil 100 to fabricate one or more Josephson junctions in accordance with one or more embodiments described herein. Repetitive description of like elements employed in other embodiments described herein is omitted for sake of brevity. In various embodiments, the second deposition angle $A_2$ can be greater than 90 degrees, as shown in FIG. 11.

FIG. 11 exemplifies an embodiment in which the top resist layer 106 is selectively positioned so as to just include the blocking portion 118. For instance, the positioning of the top resist layer 106 shown in FIG. 11 facilitates a second deposition process $D_2$ in which the deposition angle $A_2$ is greater than 90 degrees. As shown in FIG. 11, the thickness of the blocking portion 118 (e.g., along the Y-axis shown in FIG. 11) can be sufficient to shield a portion of the middle resist layer 104 in addition to the second opening 114. For example, the shielded portion of the middle resist layer 104 can be adjacent to the second opening 114. By shielding the adjacent portion of the middle resist layer 104, the blocking portion 118 can cause first superconducting material 902 coated onto the middle resist layer 104 to be recessed away from the perimeter of the second opening 114. For instance, the coated first superconducting material 902 can be recessed away from second opening 114 perimeter by a sufficient distance so at to not interfere with the depositing of second superconducting material 1002 through the second opening 114 at the second deposition angle $A_2$ during the second deposition process $D_2$ (e.g., as shown in FIG. 2).

Figure 12:
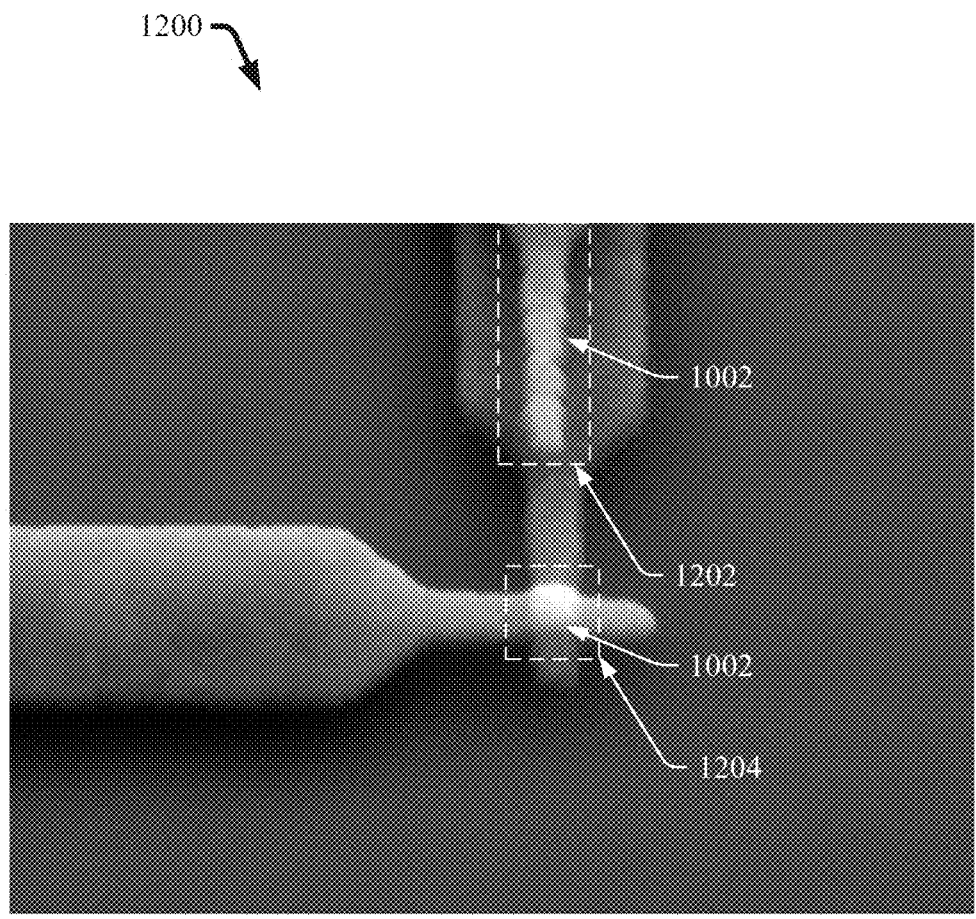
FIG. 12 depicts an example, non-limiting scanning electron microscope image demonstrating the efficacy of one or more three layer lithographic stencils in fabrication Josephson junction in accordance with one or more embodiments described herein.

FIG. 12 illustrates an example, non-limiting photo 1200 depicting second superconducting material 1002 deposited through decorated and non-decorated lithographic mask openings in accordance with one or more embodiments described herein. Repetitive description of like elements employed in other embodiments described herein is omitted for sake of brevity. The second superconducting material 1002 included in the first region 1202 of the photo 1200 was deposited into the fabrication region 110 through one or more lithographic mask openings decorated with residual superconducting material deposited from a previous deposition process. For example, a top resist layer 106 and/or a blocking portion 118 can be absent from a lithographic mask used to deposit the second superconducting material into the first region 1202. As such, the one or more openings that guide the depositing into the first region 1202 can be coated during a prior deposition process. For instance, during the prior deposition process, the one or more openings that guide the depositing into the first region 1202 could have been coated with the first superconducting material 902. Thereby, the dimensions and/or geometry of the one or more mask openings could have been altered by the addition of the coated first superconducting material 902.

In contrast, the second superconducting material 1002 included in the second region 1204 of the photo 1200 was deposited into the fabrication region 110 through one or more undecorated lithographic mask openings (e.g., shielded second openings 114). For example, a top resist layer 106 and/or a blocking portion 118 could have been included in the lithographic mask (e.g., three layer lithographic stencil 100) used to deposit the second superconducting material into the second region 1204. As such, the one or more openings that guide the depositing into the second region 1204 (e.g., second openings 114) can be shielded from a prior deposition process in accordance with the various embodiments described herein. For instance, during the prior deposition process, the one or more openings that guide the depositing into the first region 1204 (e.g., second openings 114) could have been shielded by at least the blocking portion 118. Thereby, the dimensions and/or geometry of the one or more mask openings (e.g., second openings 114) could have remained free from distortion and not coated with the first superconducting material 902.

As shown in photo 1200, edges of the second superconducting material 1002 in the first region 1202 are rough and/or distorted in comparison to the edges of the second superconducting material 1002 in the second region 1204. For example, the second superconducting material 1002 deposited into the second region 1204 can be characterized as having a smooth and/or crisply defined geometry; whereas the second superconducting material 1002 deposited into the first region 1202 can be characterized as having a rough and/or inconsistently define geometry.

Figure 13:
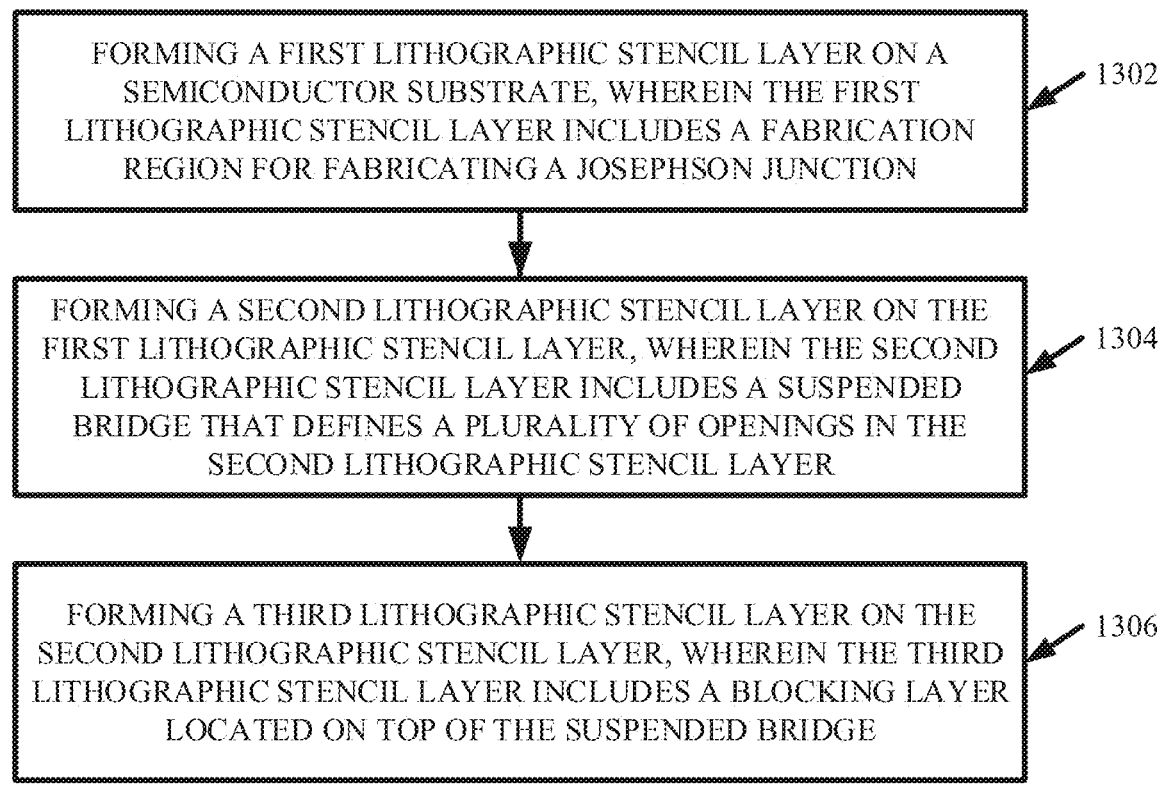
FIG. 13 illustrates a flow diagram of an example, non-limiting method that can utilizing one or more three layer lithographic stencils in fabricating one or more Josephson junctions in accordance with one or more embodiments described herein.

FIG. 13 illustrates a flow diagram of an example, non-limiting method 1300 that can facilitate fabricating one or more three layer lithographic stencils 100 (e.g., for Josephson junction fabrication) in accordance with one or more embodiments described herein. Repetitive description of like elements employed in other embodiments described herein is omitted for sake of brevity.

At 1302, the method 1300 can comprise forming a first lithographic stencil layer (e.g., bottom resist layer 102) on a semiconductor substrate 108, where the first lithographic stencil layer can include a fabrication region 110 for fabricating one or more Josephson junctions (e.g., Josephson junction structure 1006). For example, the first lithographic stencil layer (e.g., bottom resist layer 102) can be formed in accordance with at least the lithography process described herein with regards to FIGS. 1-8. In one or more embodiments, the first lithographic stencil layer (e.g., bottom resist layer 102) can be: a lift-off resist patterned with a solvent, a hard mask material patterned via one or more etching processes, and/or a photosensitive material patterned via one or more electron beam doses. In accordance with various embodiments described herein, the bottom resist layer 102 can be positioned adjacent to the fabrication region 110 and/or can provide support for the middle resist layer 104 so as to form the bridge portion 116.

At 1304, the method 1300 can comprise forming a second lithographic stencil layer (e.g., middle resist layer 104) on the first lithographic stencil layer (e.g., bottom resist layer 102), where the second lithographic stencil layer (e.g., middle resist layer 104) can include a suspended bridge (e.g., bridge portion 116) that can define a plurality of openings (e.g., first opening 112 and/or second openings 114) in the second lithographic stencil layer (e.g., middle resist layer 104). For example, the second lithographic stencil layer (e.g., middle resist layer 104) can be formed in accordance with at least the lithography process described herein with regards to FIGS. 1-8. In one or more embodiments, the second lithographic stencil layer (e.g., middle resist layer 104) can be a positive or negative resist that can be patterned via one or more electron beam doses. Additionally, the second lithographic stencil layer (e.g., middle resist layer 104) can be cast in a solvent that does not dissolve the first lithographic stencil layer (e.g., bottom resist layer 102). Further, the suspended bridge (e.g., bridge portion 116) can be formed over the fabrication region 110, such that the plurality of openings (e.g., first opening 112 and/or second opening 114) can render the fabrication region 110 exposed for one or more subsequent deposition processes.

At 1306, the method 1300 can comprise forming a third lithographic stencil layer (e.g., top resist layer 106) on the second lithographic stencil layer (e.g., middle resist layer 104), where the third lithographic stencil layer (e.g., top resist layer 106) can include one or more blocking layers (e.g., blocking portion 118) located on top of the suspended bridge (e.g., bridge portion 116). For example, the third lithographic stencil layer (e.g., top resist layer 106) can be formed in accordance with at least the lithography process described herein with regards to FIGS. 1-8. In one or more embodiments, the third lithographic stencil layer (e.g., top resist layer 106) can be a positive or negative resist that can be patterned via one or more electron beam doses. Further, the third lithographic stencil layer (e.g., top resist layer 106) can be more sensitive to the electron beam doses than the second lithographic stencil layer (e.g., middle resist layer 104). Additionally, at 1306 the third lithographic stencil layer (e.g., top resist layer 106) can be cast in a solvent that does not dissolve the second lithographic stencil layer (e.g., middle resist layer 104). Moreover, at least the third lithographic stencil layer (e.g., top resist layer 106) and/or the second lithographic stencil layer (e.g., middle resist layer 104) can be developed through the same application of a developer solution.

FIG. 14 illustrates a flow diagram of an example, non-limiting method 1400 that can facilitate fabricating one or more Josephson junction structures (e.g., Josephson junction structure 1006) using one or more three layer lithographic stencils 100 in accordance with one or more embodiments described herein. Repetitive description of like elements employed in other embodiments described herein is omitted for sake of brevity.

At 1402, the method 1400 can comprise forming a first lithographic stencil layer (e.g., bottom resist layer 102) on a semiconductor substrate 108, where the first lithographic stencil layer can include a fabrication region 110 for fabricating one or more Josephson junctions (e.g., Josephson junction structure 1006). For example, the first lithographic stencil layer (e.g., bottom resist layer 102) can be formed in accordance with at least the lithography process described herein with regards to FIGS. 1-8. In one or more embodiments, the first lithographic stencil layer (e.g., bottom resist layer 102) can be: a lift-off resist patterned with a solvent, a hard mask material patterned via one or more etching processes, and/or a photosensitive material patterned via one or more electron beam doses.

At 1404, the method 1400 can comprise forming a second lithographic stencil layer (e.g., middle resist layer 104) on the first lithographic stencil layer (e.g., bottom resist layer 102), where the second lithographic stencil layer (e.g., middle resist layer 104) can include a suspended bridge (e.g., bridge portion 116) that can define a plurality of openings (e.g., first opening 112 and/or second openings 114) in the second lithographic stencil layer (e.g., middle resist layer 104). For example, the second lithographic stencil layer (e.g., middle resist layer 104) can be formed in accordance with at least the lithography process described herein with regards to FIGS. 1-8. In one or more embodiments, the second lithographic stencil layer (e.g., middle resist layer 104) can be a positive or negative resist that can be patterned via one or more electron beam doses. Additionally, the second lithographic stencil layer (e.g., middle resist layer 104) can be cast in a solvent that does not dissolve the first lithographic stencil layer (e.g., bottom resist layer 102). Further, the suspended bridge (e.g., bridge portion 116) can be formed over the fabrication region 110, such that the plurality of openings (e.g., first opening 112 and/or second opening 114) can render the fabrication region 110 exposed for one or more subsequent deposition processes.

At 1406, the method 1400 can comprise forming a third lithographic stencil layer (e.g., top resist layer 106) on the second lithographic stencil layer (e.g., middle resist layer 104), where the third lithographic stencil layer (e.g., top resist layer 106) can include one or more blocking layers (e.g., blocking layer 118) located on top of the suspended bridge (e.g., bridge portion 116). For example, the third lithographic stencil layer (e.g., top resist layer 106) can be formed in accordance with at least the lithography process described herein with regards to FIGS. 1-8. In one or more embodiments, the third lithographic stencil layer (e.g., top resist layer 106) can be a positive or negative resist that can be patterned via one or more electron beam doses. Further, the third lithographic stencil layer (e.g., top resist layer 106) can be more sensitive to the electron beam doses than the second lithographic stencil layer (e.g., middle resist layer 104). Additionally, at 1306 the third lithographic stencil layer (e.g., top resist layer 106) can be cast in a solvent that does not dissolve the second lithographic stencil layer (e.g., middle resist layer 104). Moreover, at least the third lithographic stencil layer (e.g., top resist layer 106) and/or the second lithographic stencil layer (e.g., middle resist layer 104) can be developed through the same application of a developer solution.

At 1408, the method 1400 can comprise depositing (e.g., via a first deposition process $D_1$) at a first angle (e.g., first deposition angle $A_1$), onto the semiconductor substrate 108 within the fabrication region 110, a first superconducting material 902 through a first opening 112 from the plurality of openings, where the blocking layer (e.g., blocking portion 118) can protect a second opening 114 from the plurality of openings from being coated with the first superconducting material 902. For example, the depositing at 1408 can be performed in accordance with the first deposition process $D_1$ described with regards to at least FIG. 9. For instance, the first superconducting material 902 can be deposited into the first opening 112, where a side surface of the first opening 112 (e.g., a side surface of middle resist layer 104) and/or a side surface of the blocking layer (e.g., a side surface of the blocking portion 118 that faces toward the first opening 112) can be coated with the first superconducting material 902. However, the blocking layer (e.g., blocking portion 118) can shield the second opening 114 from being coated by during the first deposition process $D_1$.

At 1410, the method 1400 can comprise depositing (e.g., via a second deposition process $D_2$) at a second angle (e.g., second deposition angle $A_2$), onto the semiconductor substrate 108 within the fabrication region 110, a second superconducting material 1002 through the second opening 114. For example, the depositing at 1410 can be performed in accordance with the second deposition process $D_2$ described herein with regards to at least FIGS. 10-11. For instance, the second superconducting material 1002 can be deposited through the second opening 114 free of interference by residual first superconducting material 902 coated onto the three layer stencil 100 during the first deposition process $D_1$.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   depositing a first resist layer onto a second resist layer, wherein the first resist layer includes a bridge portion that defines an opening for forming a Josephson junction; and
   depositing a third resist layer onto the bridge portion, wherein the third resist layer shields the opening from an angled deposition of a superconducting material during fabrication of the Josephson junction.

2. The method of claim 1, further comprising:
   depositing the superconducting material via the angled deposition at a first angle through a second opening in the first resist layer; and
   depositing a second superconducting material at a second angle through the opening in the first resist layer.

3. The method of claim 2, wherein the depositing the first resist layer comprises casting the first resist layer in a first solvent, wherein the depositing the third resist layer comprises casting the third resist layer in a second solvent, wherein the first resist layer is non-soluble with regards to the first solvent, and wherein the first resist layer is non-soluble with regards to the second solvent.

4. The method of claim 2, wherein the superconducting material comprises at least one member selected from the group consisting of niobium, aluminum, vanadium, titanium, tantalum, titanium nitride, and niobium nitride, and wherein the second superconducting material comprises at least one member selected from the group of niobium, aluminum, vanadium, titanium, tantalum, titanium nitride, and niobium nitride.

5. The method of claim 1, wherein the second resist layer comprises polydimethylglutarimide, wherein the first resist layer comprises polymethylmethacrylate, and wherein the third resist layer comprises poly(methylmethacrylate/methacrylic acid) copolymer.

6. A method, comprising:
forming a patterned resist layer onto a lift-off resist layer, wherein the patterned resist layer includes a bridge portion that defines an opening in the patterned resist layer; and
forming a blocking resist layer onto the bridge portion, wherein the blocking resist layer reduces exposure of the opening to an angled deposition of a superconducting material during fabrication of a Josephson junction.

7. The method of claim 6, further comprising:
depositing the superconducting material, via the angled deposition, through a second opening in the patterned resist layer and onto a semiconductor substrate; and
depositing a second superconducting material through the opening and onto the superconducting material.

8. The method of claim 7, wherein the superconducting material is deposited through the second opening at a first angle with respect to the semiconductor substrate, wherein the second superconducting material is deposited through the opening at a second angle with respect to the semiconductor substrate, and wherein the first angle is different than the second angle.

9. The method of claim 8, further comprising:
oxidizing the superconducting material prior to the depositing the second superconducting material.

10. A method, comprising:
depositing a first lithographic stencil layer onto a second lithographic stencil layer, wherein the first lithographic stencil layer includes a bridge portion that defines an opening for fabricating a Josephson junction on a substrate; and
depositing a third lithographic stencil layer onto the first lithographic stencil layer, wherein the third lithographic stencil layer includes a blocking portion located on top of the bridge portion.

11. The method of claim 10, further comprising:
depositing, at a first angle, a first superconducting material through a second opening in the first lithographic stencil layer and onto the substrate, wherein the blocking portion protects the opening from being coated by the first superconducting material.

12. The method of claim 11, further comprising:
depositing, at a second angle, a second superconducting material through the opening and onto the first superconducting material.

13. The method of claim 12, wherein the first superconducting material and the second superconducting material comprise aluminum.

14. The method of claim 12, further comprising:
oxidizing the first superconducting material prior to the depositing the second superconducting material.

15. A method, comprising:
forming a first lithographic stencil layer onto a second lithographic stencil layer, wherein the first lithographic stencil layer includes a suspended bridge portion, and wherein the first lithographic stencil layer includes an opening along a side of the suspended bridge portion; and
forming a third lithographic stencil layer on top of the suspended bridge portion and adjacent to the opening.

16. The method of claim 15, further comprising:
depositing, at a first angle, a first superconducting material through a second opening in the first lithographic stencil layer and onto a substrate, wherein the third lithographic stencil layer protects the opening from being coated by the first superconducting material.

17. The method of claim 16, further comprising:
depositing, at a second angle, a second superconducting material through the opening and onto the first superconducting material.

18. The method of claim 17, wherein the first superconducting material and the second superconducting material comprise aluminum, wherein the second lithographic stencil layer comprises polydimethylglutarimide, wherein the first lithographic stencil layer comprises polymethylmethacrylate, and wherein the third lithographic stencil layer comprises methyl poly(methylmethacrylate/methacrylic acid) copolymer.

19. The method of claim 17, further comprising:
oxidizing the first superconducting material prior to the depositing the second superconducting material.

* * * * *